(12) United States Patent
Cheng et al.

(10) Patent No.: US 10,872,921 B2
(45) Date of Patent: Dec. 22, 2020

(54) IMAGE SENSOR AND METHOD FOR FABRICATING THE IMAGE SENSOR

(71) Applicant: TAIWAN SEMICONDUCTOR MANUFACTURING CO., LTD., Hsinchu (TW)

(72) Inventors: Yun-Wei Cheng, Taipei (TW); Chun-Hao Chou, Tainan (TW); Kuo-Cheng Lee, Tainan (TW); Hsin-Chi Chen, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/118,335

(22) Filed: Aug. 30, 2018

(65) Prior Publication Data

US 2020/0075661 A1 Mar. 5, 2020

(51) Int. Cl.
*H01L 27/146* (2006.01)
*G01S 7/486* (2020.01)
*H04N 5/33* (2006.01)
*H01L 31/062* (2012.01)

(52) U.S. Cl.
CPC .... *H01L 27/14643* (2013.01); *H01L 27/1461* (2013.01); *H01L 27/1462* (2013.01); *H01L 27/14612* (2013.01); *H01L 27/14629* (2013.01); *H01L 27/14685* (2013.01); *H01L 27/14689* (2013.01); *H01L 27/1463* (2013.01); *H01L 27/14621* (2013.01); *H01L 27/14636* (2013.01)

(58) Field of Classification Search
CPC ......... H01L 27/14643; H01L 27/14616; H01L 27/14689; H01L 29/0684; H01L 29/0847; H01L 29/41783; H01L 27/1463; H01L 27/14612
See application file for complete search history.

(56) References Cited

U.S. PATENT DOCUMENTS

| | | | |
|---|---|---|---|
| 2005/0263805 A1* | 12/2005 | Mouli | H01L 27/14625 257/292 |
| 2007/0138590 A1* | 6/2007 | Wells | H01L 27/1462 257/462 |
| 2010/0117108 A1* | 5/2010 | Gaebler | H01L 31/103 257/98 |
| 2012/0235212 A1* | 9/2012 | Chen | H01L 27/14603 257/223 |
| 2012/0313204 A1* | 12/2012 | Haddad | H01L 27/1462 257/432 |

(Continued)

*Primary Examiner* — Brian Turner
(74) *Attorney, Agent, or Firm* — Maschoff Brennan

(57) ABSTRACT

An image sensor and a method for fabricating the image sensor are provided. In the method for fabricating the image sensor, at first, a substrate having a first surface and a second surface opposite to the first surface is provided. Then, light-sensitive regions are formed in the substrate. Thereafter, transfer gate structures are formed on the first surface of the substrate. Then, the first surface of the substrate is formed to form recess structures on the light-sensitive regions. Thereafter, light-reflective layers are formed to cover the recess structures of the first surface of the substrate, in which the recess structures are filled with protrusion structures of the light-reflective layers. Further, the second surface of the substrate may be etched to form recess structures corresponding to the light-sensitive regions.

20 Claims, 33 Drawing Sheets

(56) References Cited

U.S. PATENT DOCUMENTS

| | | | |
|---|---|---|---|
| 2013/0200251 A1* | 8/2013 | Velichko | H01L 31/02327 250/208.1 |
| 2013/0207214 A1* | 8/2013 | Haddad | H01L 31/0236 257/432 |
| 2016/0163747 A1* | 6/2016 | Koide | H01L 27/1443 257/80 |
| 2017/0110493 A1* | 4/2017 | Yokogawa | H01L 31/028 |
| 2017/0236854 A1* | 8/2017 | Lee | H01L 27/1464 257/432 |

* cited by examiner

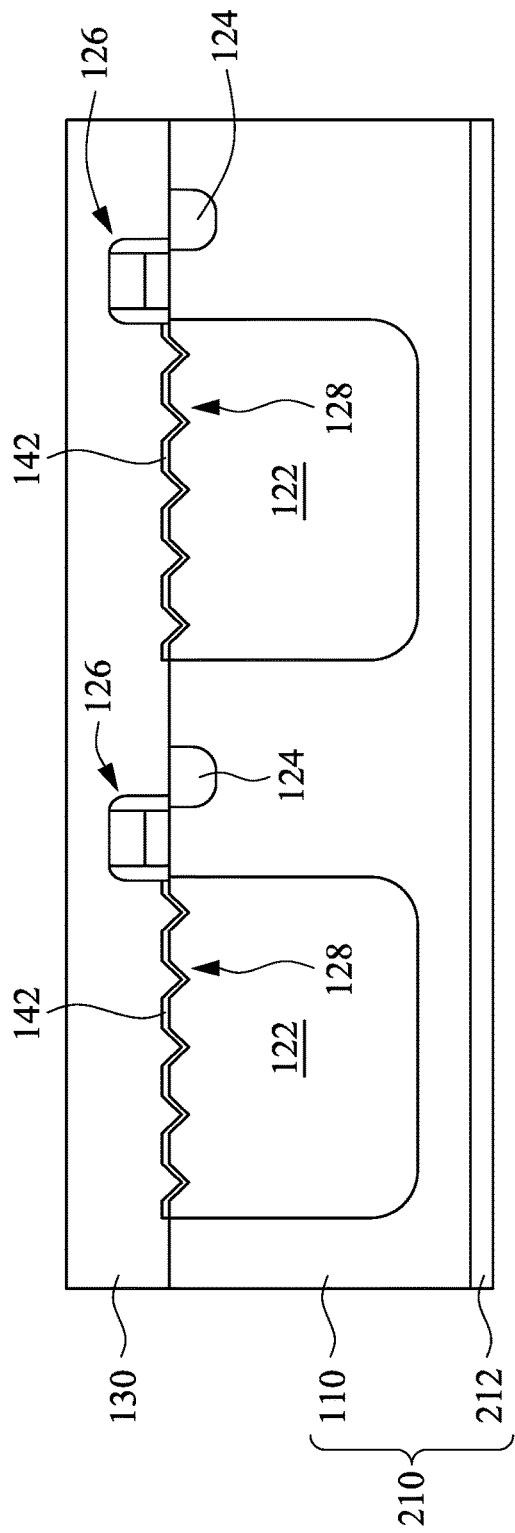
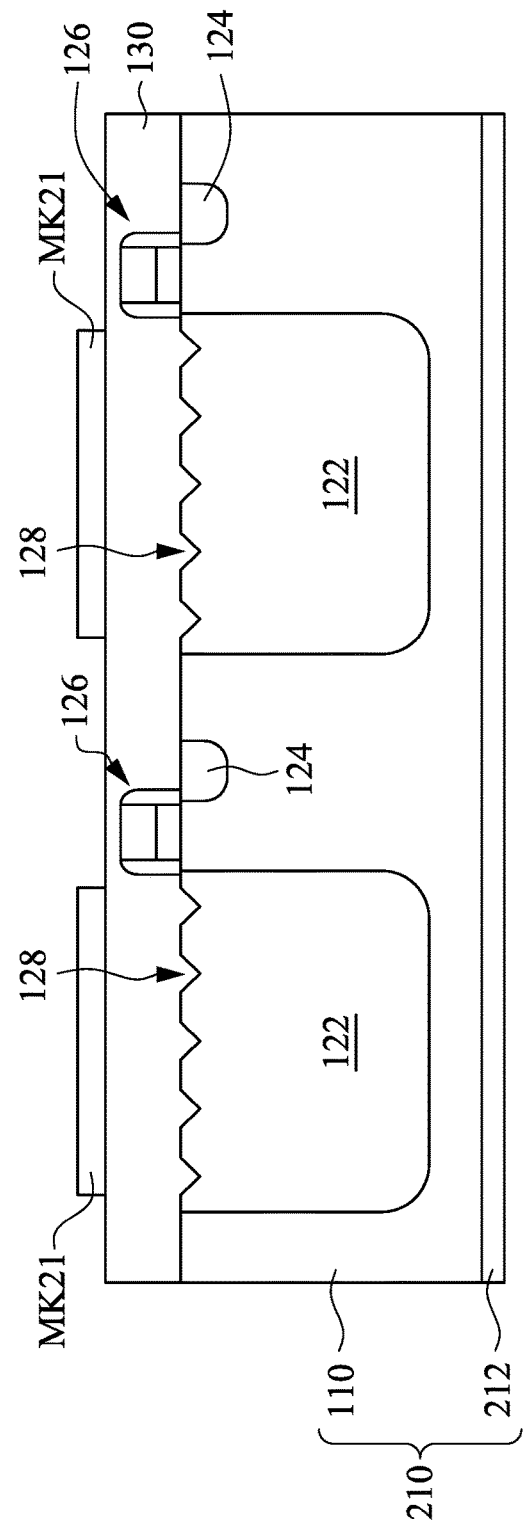
Fig. 2D'
Fig. 2E

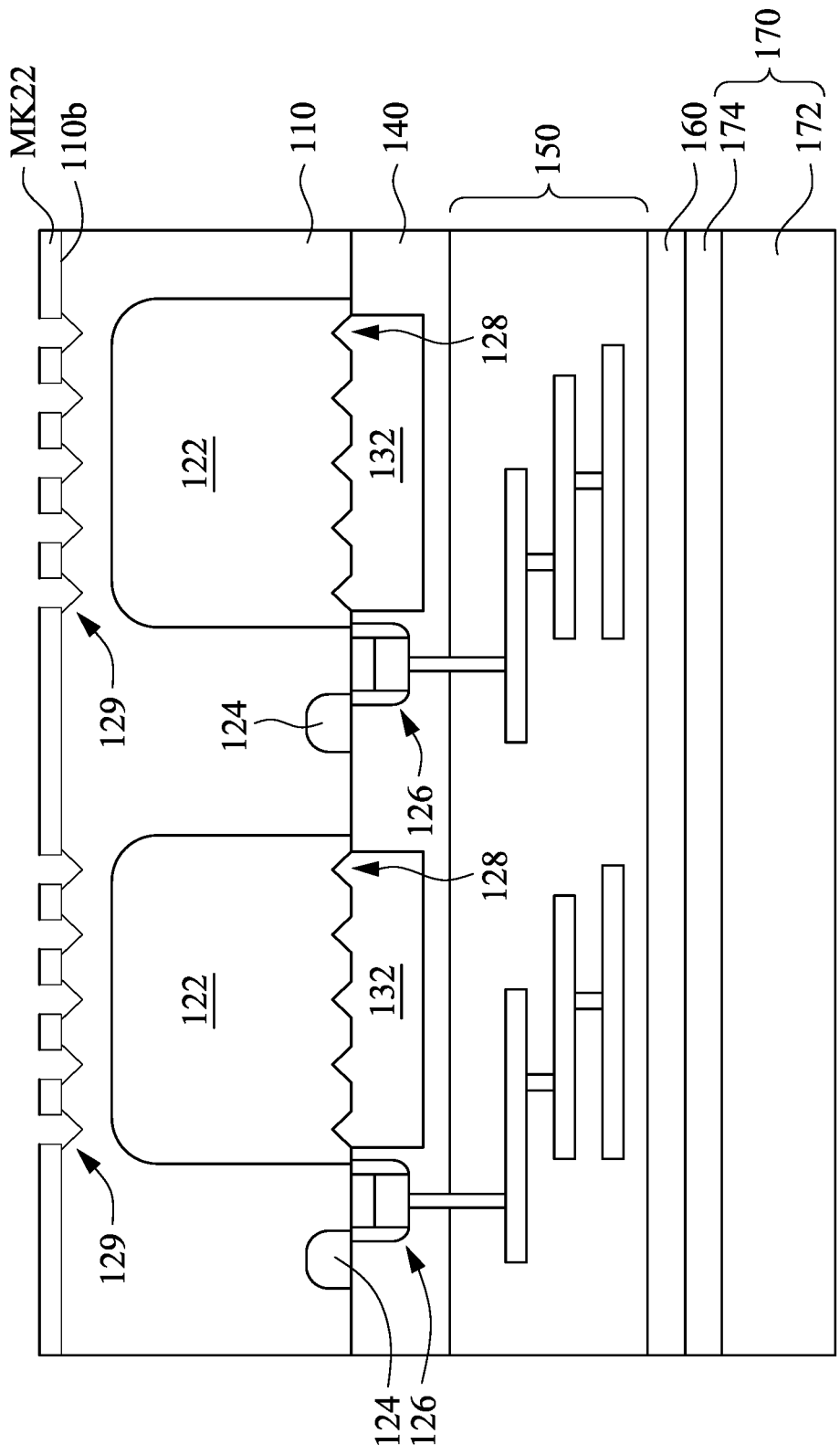

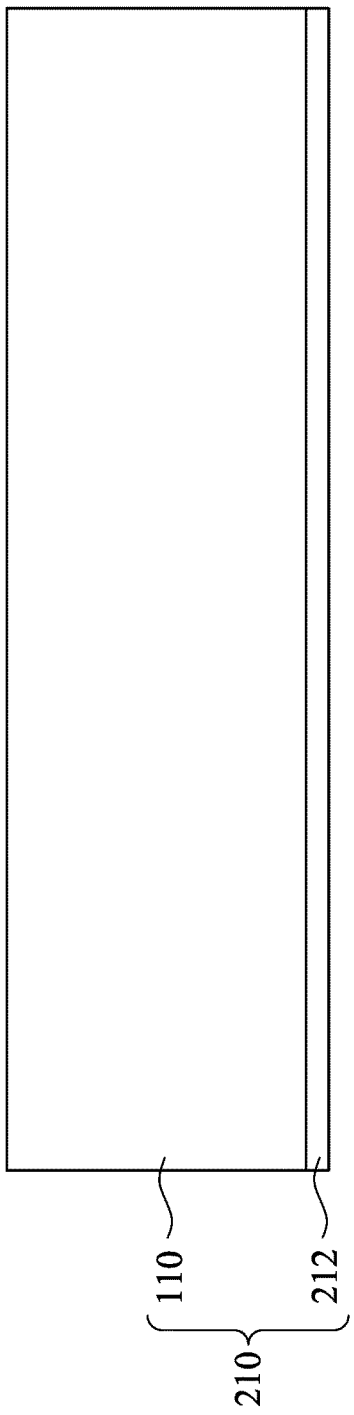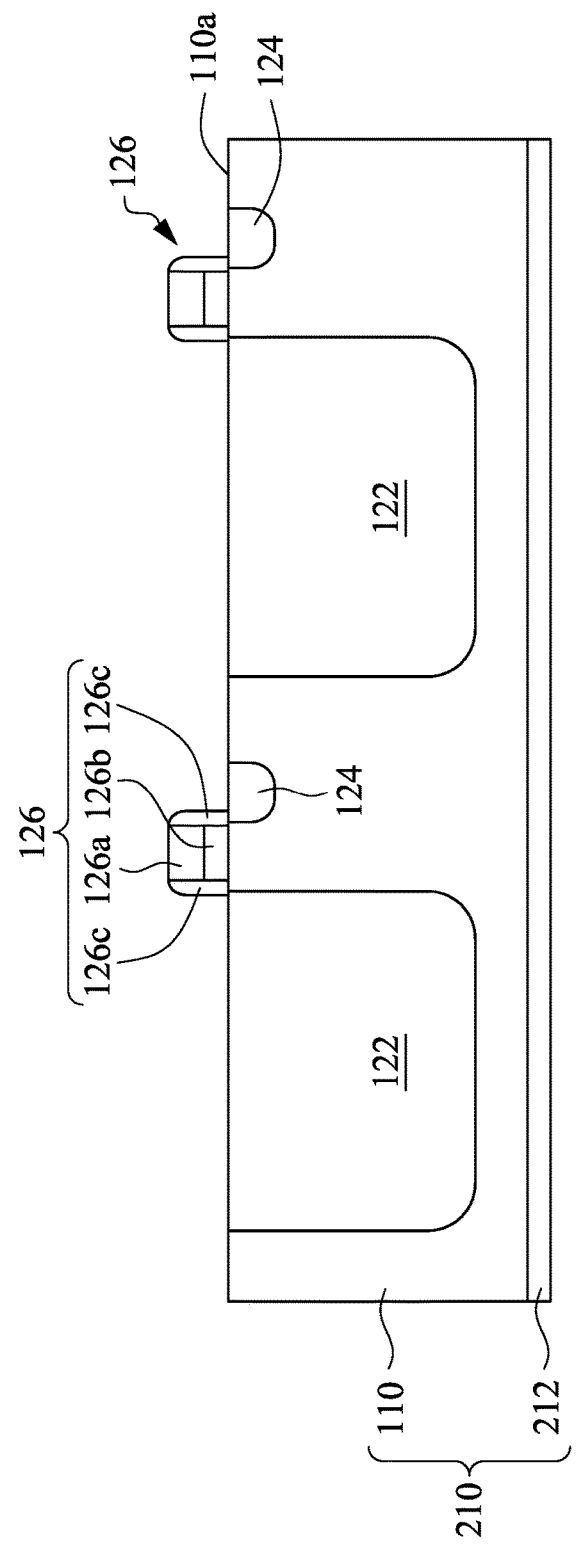

IMAGE SENSOR AND METHOD FOR FABRICATING THE IMAGE SENSOR

BACKGROUND

In semiconductor technology, image sensors are used for sensing light emitted towards them to form an image. For converting various photo energy of the light into electrical signals, the image sensor includes pixels having photosensitive diodes, reset transistors, source follower transistors, pinned layer photodiodes, and/or transfer transistors. In general, the image sensor may be a complementary metal-oxide-semiconductor (CMOS) image sensor (CIS), an active-pixel sensor (APS), a passive-pixel sensor and a charged-coupled device (CCD) sensor. The above image sensor is widely used in various applications such as digital camera or mobile phone camera devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7A to FIG. 7I are cross-sectional views of intermediate stages showing a method for fabricating an image sensor in accordance with some embodiments of the present disclosure.

DETAILED DESCRIPTION

Figure 1A:
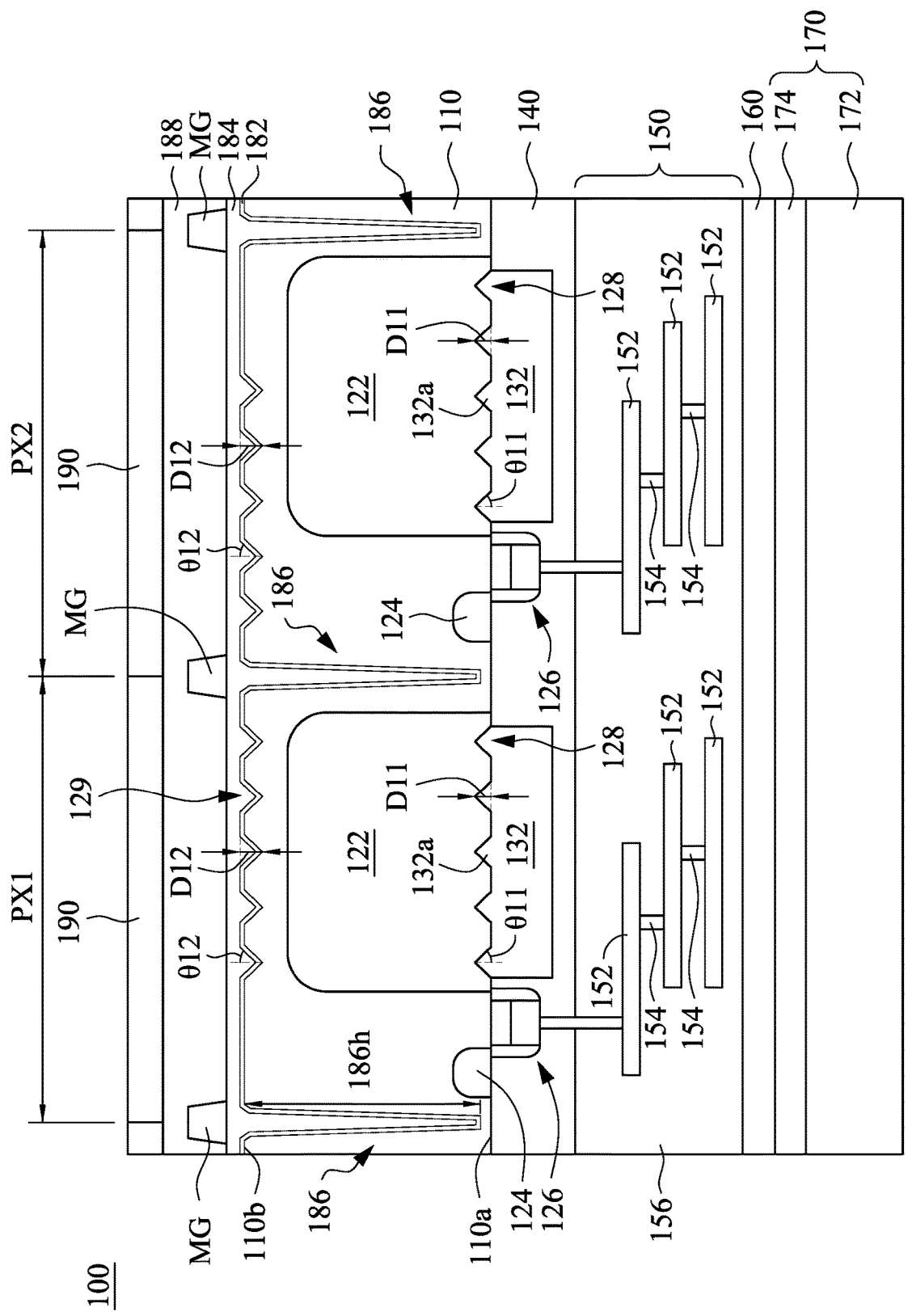
FIG. 1A is a schematic cross-sectional view of an image sensor in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

Image sensors, such as proximity image sensors/motion image sensors, are designed to have an infrared function. However, when infrared light is emitted to the image sensor, the infrared light may pass through light-sensitive regions of the image sensor and a few portions of the infrared light are received by the light-sensitive regions. For example, a significant portion of the infrared light may pass through the light-sensitive regions due to the long wavelength of the infrared light. Therefore, a problem of Quantum Efficiency (QE) of the image sensor is caused due to the long wavelength of the infrared light.

Embodiments of the present disclosure are directed to an image sensor and a method for fabricating the image sensor. The image sensor includes a substrate, transfer gates and at least one light-reflective layer. The substrate includes plural light-sensitive regions for receiving light, and the transfer gates are disposed on a first surface of the substrate corresponding to the light-sensitive regions. In some embodiments, the first surface of the substrate is etched to form plural recess structures, and the at least one light-reflective layer is formed covering the first surface of the substrate, such that the at least one light-reflective layer has plural protrusion structures matching with the recess structures of the first surface of the substrate. When light having a long wavelength (such as infrared/near-infrared) are emitted to the image sensor, the light can be reflected by the protrusion structures of the light-reflective layer after passing through the light-sensitive region. Therefore, the paths of the light are increased because of the reflection, opportunity of light absorption is increased, and QE of the image sensor is improved.

FIG. 1A is a schematic cross-sectional view of an image sensor 100 in accordance with some embodiments of the present disclosure. The image sensor 100 includes a substrate 110 having light-sensing regions 122 and floating nodes 124, transfer gate structures 126, light-reflective layers 132, an interlayer dielectric (ILD) layer 140, a metal line of a back end of line (BEOL) metallization stack 150, passivation layers 160 and 188, a carrier 170, dielectric layers 182 and 184, a metal grid MG and color filter layers 190.

The substrate 110 has a first surface 110a and a second surface 110b opposite to the first surface 110a, and the light-sensing regions 122 and the floating nodes 124 are formed by doping the first surface 110a. In some embodiments, the first surface 110a of the substrate 110 is doped with an n-type dopant to form the light-sensing regions 122 and the floating nodes 124. In some embodiments, the substrate 110 may include a semiconductor material and may include a graded layer or a buried oxide, for example. In some embodiments, the substrate 110 includes bulk silicon that may be undoped or doped (e.g., p-type, n-type, or a combination thereof). Other materials that are suitable for semiconductor device formation may be used. Other materials, such as germanium, quartz, sapphire, and glass, could alternatively be used for the substrate 110. Alternatively, the substrate 110 may be an epitaxy layer including epitaxy silicon.

The transfer gate structures 126 are disposed on the first surface 110a and located between the light-sensing regions 122 and the floating nodes 124. The transfer gate structures 126 are configured to control transmission of the electrons from the light-sensing regions 122 to the floating nodes 124. For example, when light is emitted to the light-sensing regions 122, photons of the light are converted to electrons by the light-sensing regions 122 and transmitted to the floating nodes 124 by using the transfer gate structures 126. In some embodiments, each of the transfer gate structures 126 includes a poly gate electrode 126a, a gate dielectric layer 126b and spacers 126c, but embodiments of the present disclosure are not limited thereto.

The first surface 110a has recess structures 128 corresponding to the light-sensing regions 122. In some embodiments, each of the recess structures 128 of the first surface 110a is an inverted pyramid recess as shown in FIG. 1C. FIG. 1C is a schematic top view of the recess structures 128 corresponding one light-sensing region 122. The recess structures 128 are arranged to form a periodic structure PS11 on the corresponding light-sensing region 122. In some embodiments, the recess structures 128 may be formed on all light-sensing regions 122. In some embodiments, the recess structures 128 may be formed on a part of the light-sensing regions 122.

The light-reflective layers 132 are disposed on the recess structures 128 of the first surface 110a. In some embodiments, the light-reflective layers 132 cover the light-sensing regions 122 in a one-to-one manner, and each of the light-reflective layers 132 has protrusion portions 132a matching with the recess structures 128. In some embodiments, because the recess structures 128 of the first surface 110a are inverted pyramid recesses arranged in a periodic structure, the protrusion portions 132a of the light-reflective layers 132 are pyramids arranged in another periodic structure. In some embodiments, each of the light-reflective layers 132 includes metal for light reflection.

Figure 1B:
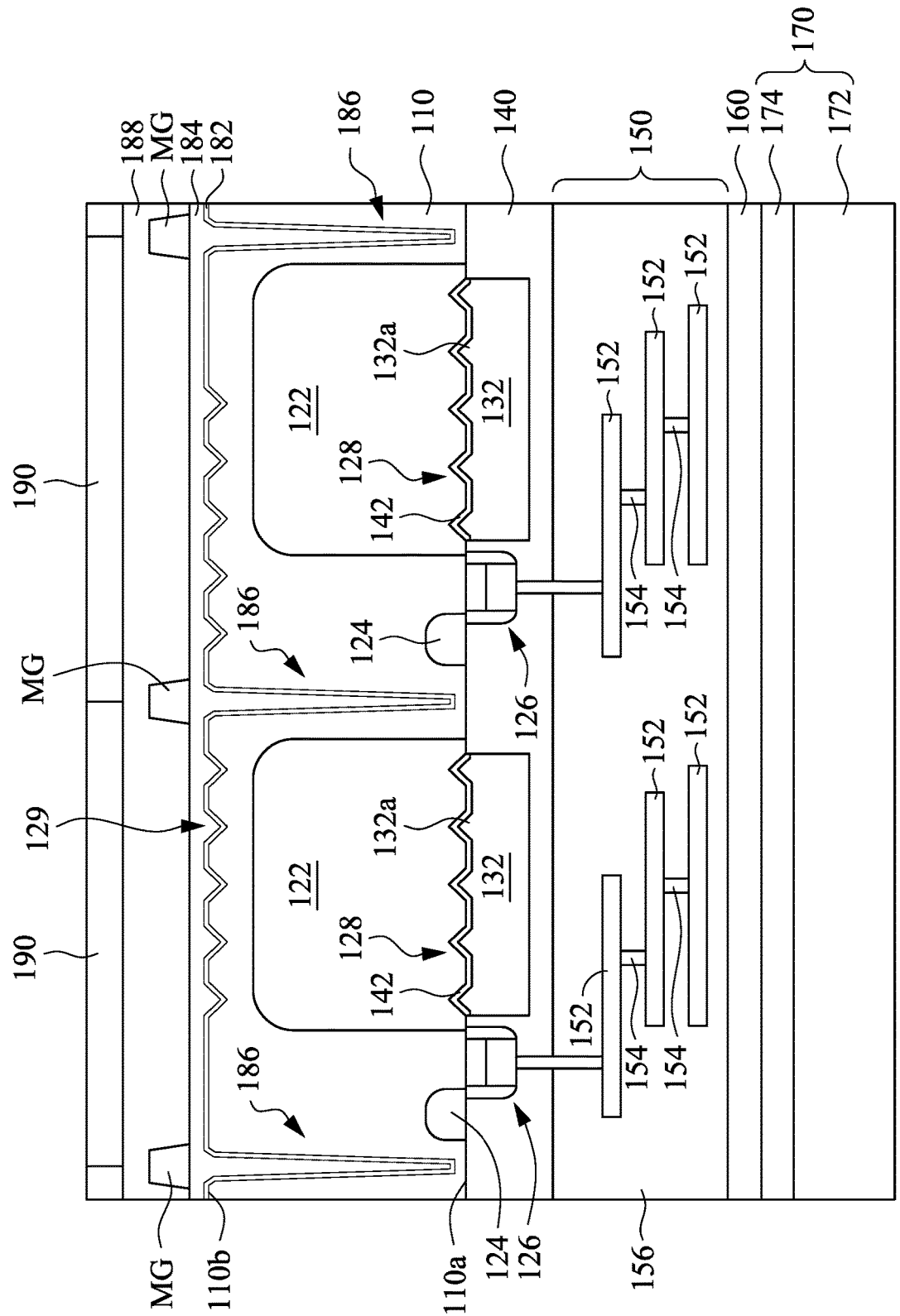
FIG. 1B is a schematic cross-sectional view of an image sensor in accordance with certain embodiments of the present disclosure.
Figure 1C:
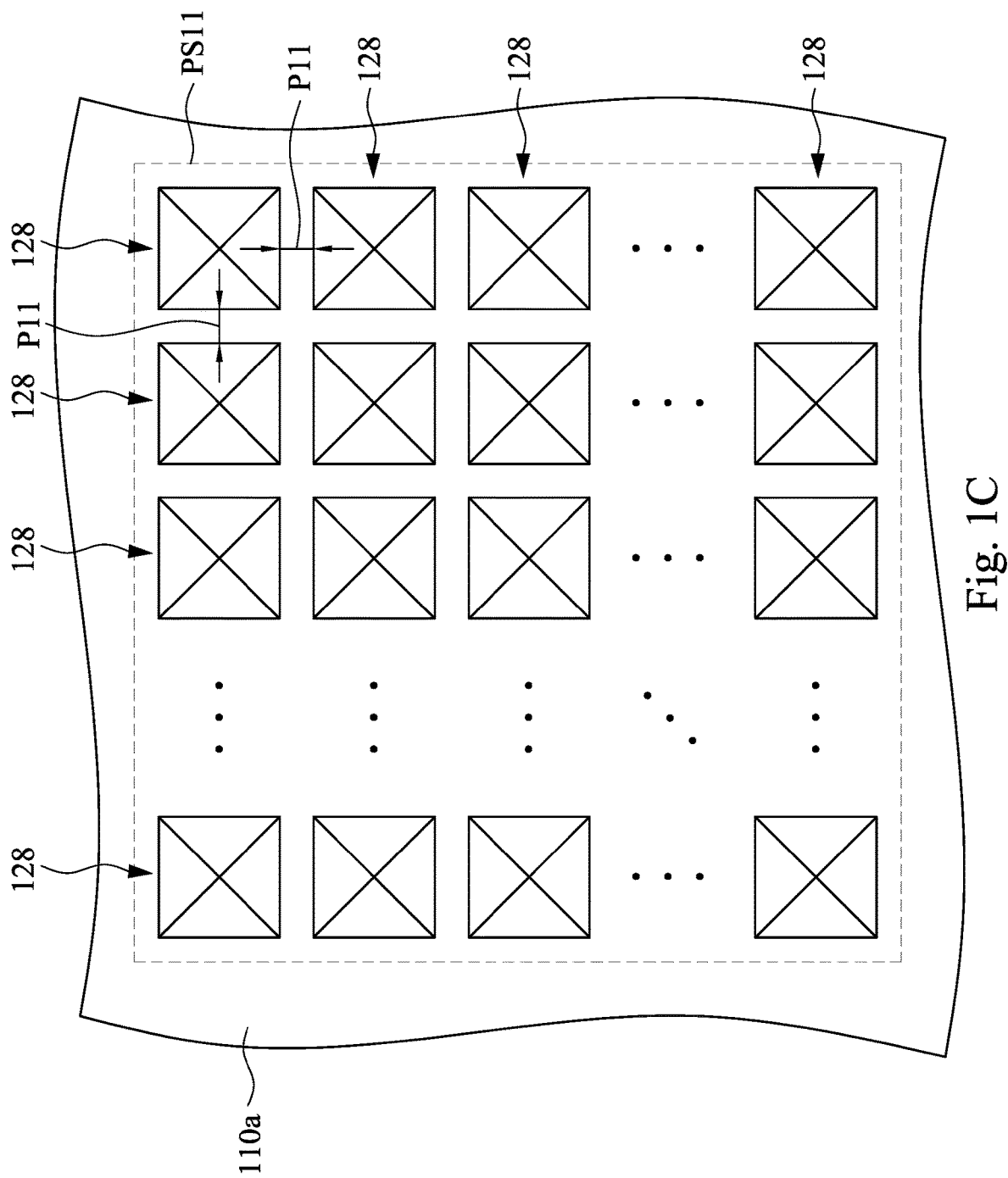
FIG. 1C is a schematic top view of recess structures corresponding one light-sensing region in accordance with some embodiments of the present disclosure.

In some embodiments, liners 142 can be disposed on each of the recess structures 128 of the first surface 110a as shown in FIG. 1B. In some embodiments, the recess structures 128 of the first surface 110a may be formed by etching the first surface 110a. Because there may be dangling bonds or defects on the recess structures 128 after the first surface 110a is etched, the liners 142 are formed on the recess structures 128 to remove the dangling bonds or defects. In some embodiments, the liners 142 may include silicon oxide, silicon nitride, silicon oxynitride, or phosphosilicate glass (PSG).

The interlayer dielectric layer 140 is disposed on the first surface 110a of the substrate 110 and covers the transfer gate structures 126 and the light-reflective layers 132. In some embodiments, the interlayer dielectric layer 140 may be, for example, silicon dioxide, silicon nitride, a low k dielectric (e.g., fluorosilicate glass (FSG)), some other dielectric, or a combination of the foregoing.

The BEOL metallization stack 150 is disposed on the interlayer dielectric layer 140 to provide electric connections of elements/regions, for example the transfer gate structures 126. The BEOL metallization stack 150 includes metallization layers 152 stacked within an interlayer dielectric layer 156. The metallization layers 152 are electrically connected to one another by vias 154. The interlayer dielectric layer 156 may be, for example, a low k dielectric material (i.e., a dielectric with a dielectric constant less than about 3.9) or an oxide. The metallization layers 152 and vias 154 may include a metal material such as aluminum copper, aluminum, germanium, copper, tungsten or some other metal.

The passivation layer 160 is disposed on the BEOL metallization stack 150 for wafer bonding. In some embodiments, the passivation layer 160 may include silicon dioxide. The carrier 170 includes a semiconductor wafer 172 and a passivation layer 174 disposed on the semiconductor wafer 172. In some embodiments, the passivation layer 174 may include silicon dioxide. Therefore, the passivation layer 160 and the passivation layer 174 of the carrier 170 can be bonded together by van der Waals forces. In some embodiments, the semiconductor wafer 172 may include amplifier circuits for amplifying the signals of the light-sensitive regions 122, but embodiments of the present disclosure are not limited thereto.

Figure 1D:
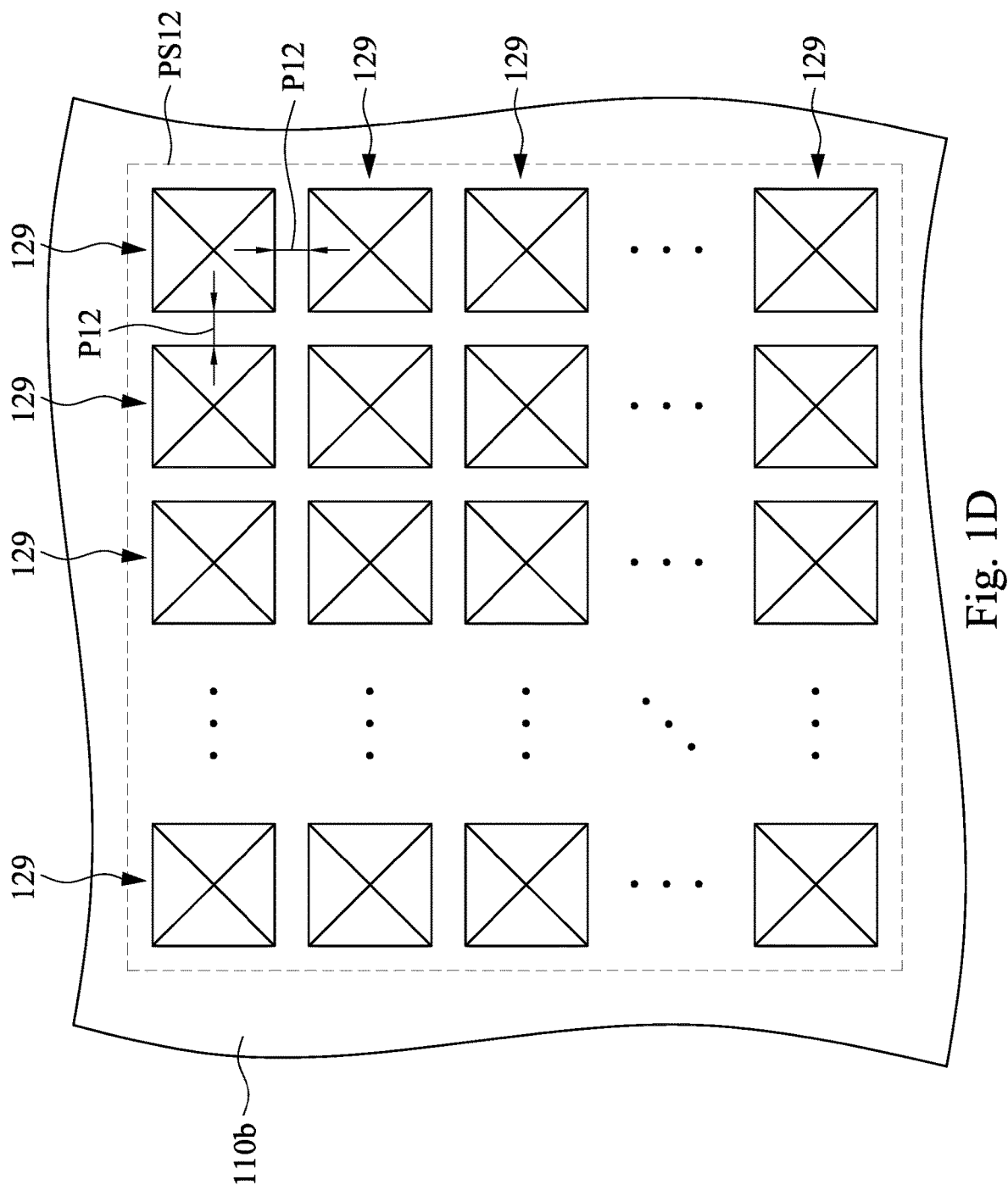
FIG. 1D is a schematic top view of the recess structures corresponding one light-sensing region in accordance with certain embodiments of the present disclosure.

The second surface 110b of the substrate 110 has recess structures 129 corresponding to the light-sensing regions 122. In some embodiments, each of the recess structures 129 of the second surface 110b is an inverted pyramid recess as shown in FIG. 1D. FIG. 1D is a schematic top view of the recess structures 129 corresponding one light-sensing region 122. The recess structures 129 are arranged to form a periodic structure PS12 on the corresponding light-sensing region 122.

The dielectric layers 182 and 184 are disposed on the second surface 110b to fill the recess structures 129 and fill deep trenches of the substrate 110 to form back-side deep trench isolations (BDTIs) 186 located between the light-sensing regions 122. In some embodiments, the dielectric layer 182 may be a high-k material such as a hafnium oxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, titanium nitride (TiN). In some embodiments, the dielectric layer 184 may include silicon dioxide. In some embodiments, a height 186h of the back-side deep trench isolation 186 is equal to a value from 50% of a thickness of the substrate 110 to 100% of a thickness of the substrate 110. In other words, the back-side deep trench isolation 186 may pass through the substrate 110. In some embodiments, the back-side deep trench isolations 186 are formed in a shape of a grid.

The passivation layer 188 is disposed on the dielectric layer 184 and the color filter layers 190 are disposed on the passivation layer 188. The color filter layers 190 are disposed corresponding to the light-sensitive regions 122. In some embodiments, the color filter layers 190 include red color filters, blue color filters and green color filters to receive red light, blue light and green light. In some embodiments, material of the color filters 190 includes silicon dioxide, silicon nitride, polymers, or other dielectrics, oxides, or polymers. In some embodiments, the passivation layer 188 may include silicon oxide, silicon nitride, low-k dielectrics such as carbon doped oxides, extremely low-k dielectrics such as porous carbon doped silicon dioxide, combinations of these, or the like.

The metal grid MG is disposed under the color filter layers 190 to reduce light cross-talk between neighboring pixels. For example, the light emitted from the pixel PX1 to PX2 may be reflected back to the pixel PX1 by the metal grid MG, and the light emitted from the pixel PX2 to pixel PX1 may be reflected back to the pixel PX2 by the metal grid MG, such that the light cross-talk between pixels PX1 and PX2 can be reduced by the metal grid MG. In some embodiments, the metal grid MG includes a suitable metal material, such as titanium, titanium nitride, tantalum, tantalum nitride, aluminum, tungsten, copper, copper alloy, alloys thereof, or combinations thereof.

In the embodiment shown in FIG. 1A, the surface 110b having the recess structures 129 improves the Quantum Efficiency (QE) of the image sensor 100. For example, the light passing through the surface 110b of the substrate 110 may be reflected back if the surface 110b of the substrate 110 is a flat surface, and less light is received by the light-sensing regions 122. To reduce the reflection of the light, the surface 110b of the substrate 110 is formed to have the recess structures 129, such that more light is received by the light-sensing regions 122 and the QE of the image sensor 100 is improved.

In some embodiments, as shown in FIG. 1D, a pitch P12 between adjacent two recess structures 128 is from about 0.1 um to about 0.5 um. In some embodiments, as shown in FIG. 1A, a depth D12 of each of the recess structures 129 is from about 20 nm to about 500 nm. In some embodiments, as shown in FIG. 1A, a tapered angle of each of the recess structures 129 is from about 45 degrees to about 60 degrees. The topology and arrangement of the recess structures 129 enable the recess structures 129 to significantly benefit the reduction of the reflection of the light. However, the recess structures 129 slightly benefit the reduction of the reflection of the light, if the pitch P12 is not in the range from about 0.1 um to about 0.5 um, or the depth D12 of each of the recess structures 129 is not in the range from about 20 nm to about 500 nm, or a tapered angle $\theta 12$ of each of the recess structures 129 is not in the range from about 45 degrees to about 60 degrees.

Further, in the embodiment shown in FIG. 1A, the light-reflective layers 132 improve the QE of the image sensor 100. For example, it is difficult to absorb light having a long wavelength (for example, infrared light) when the light pass though the light-sensing regions 122. Therefore, as shown in FIG. 1A, the light-reflective layers 132 are provided on the surface 110a of the substrate 110 to reflect light passing through the light-sensing regions 122. Because the light passing through the light-sensing regions 122 is reflected back to the light-sensing regions 122, the light passing through the light-sensing regions 122 has longer light paths in the light-sensing regions 122, and opportunity of light absorption of the light-sensing regions 122 is increased, and the QE of the image sensor is improved accordingly.

Further, because the light-reflective layer 132 has protrusion portions 132a filling the recessed structures 128 of the surface 110a of the substrate 110, the shape of the protrusion portions 132a matches the shape of the recessed structures 128 of the surface 110a. In some embodiments, the recessed structures 128 of the surface 110a are designed to be inverted pyramid recesses, such that the protrusion portions 132a of the light-reflective layer 132 are formed to have a shape of pyramid. The protrusion portions 132a having the pyramid shape are capable of increasing the light paths of the light passing through the light-sensing regions 122 when the light is reflected by the protrusion portions 132a of the light-reflective layer 132, thereby improving the QE of the image sensor. Further, because the light paths are increased, a thickness of the substrate 110 can be decreased accordingly.

In some embodiments, as shown in FIG. 1C, a pitch P11 between adjacent two recess structures 128 is from about 0.1 um to about 0.5 um. In some embodiments, as shown in FIG. 1A, a depth D11 of each of the recess structures 128 is from about 20 nm to about 500 nm. In some embodiments, as shown in FIG. 1A, a tapered angle $\theta 11$ of each of the recess structures 128 is from about 45 degrees to about 60 degrees. The topology and arrangement of the recess structures 128 enable the protrusion portions 132a of the light-reflective layer 132 to significantly increase the light paths. However, the protrusion portions 132a of the light-reflective layer 132 may slightly increase the light paths, if the pitch P11 is not in the range from about 0.1 um to about 0.5 um, or the depth D11 of each of the recess structures 128 is not in the range from about 20 nm to about 500 nm, or the tapered angle $\theta 11$ of each of the recess structures 128 is not in the range from about 45 degrees to about 60 degrees.

Figure 2A:
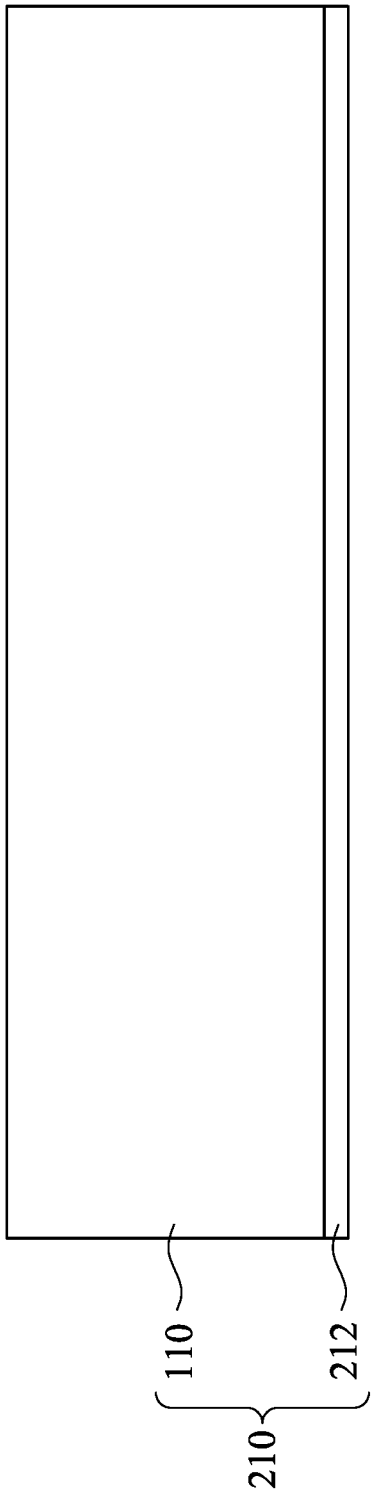
FIG. 2A to FIG. 2P are cross-sectional views of intermediate stages showing a method for fabricating an image sensor in accordance with some embodiments of the present disclosure.
Figure 2B:
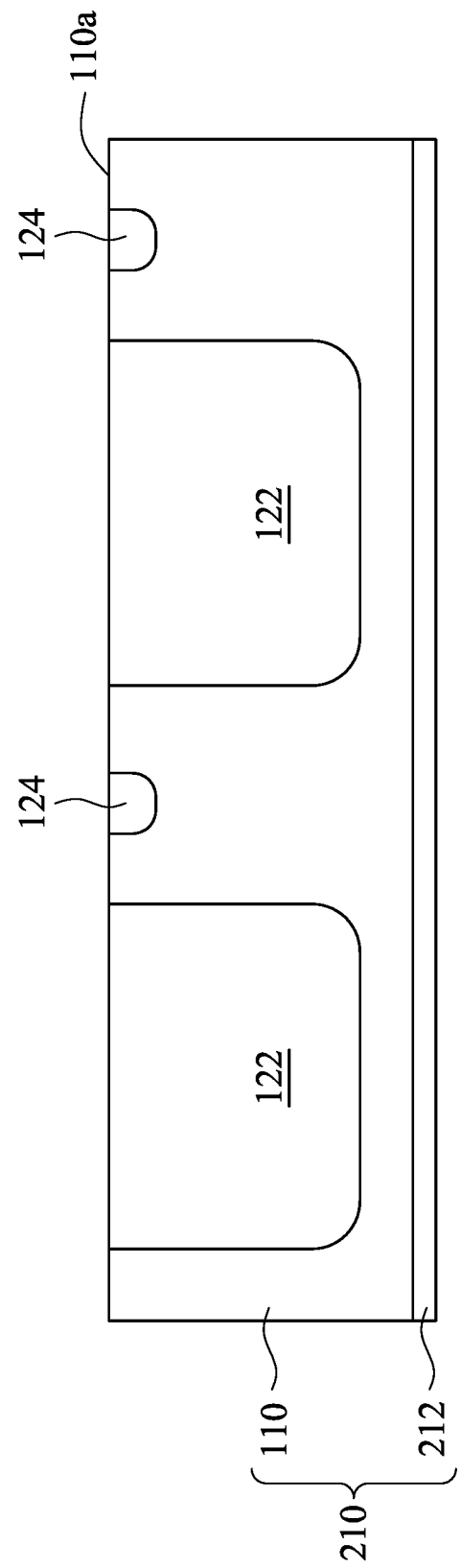
Figure 2C:
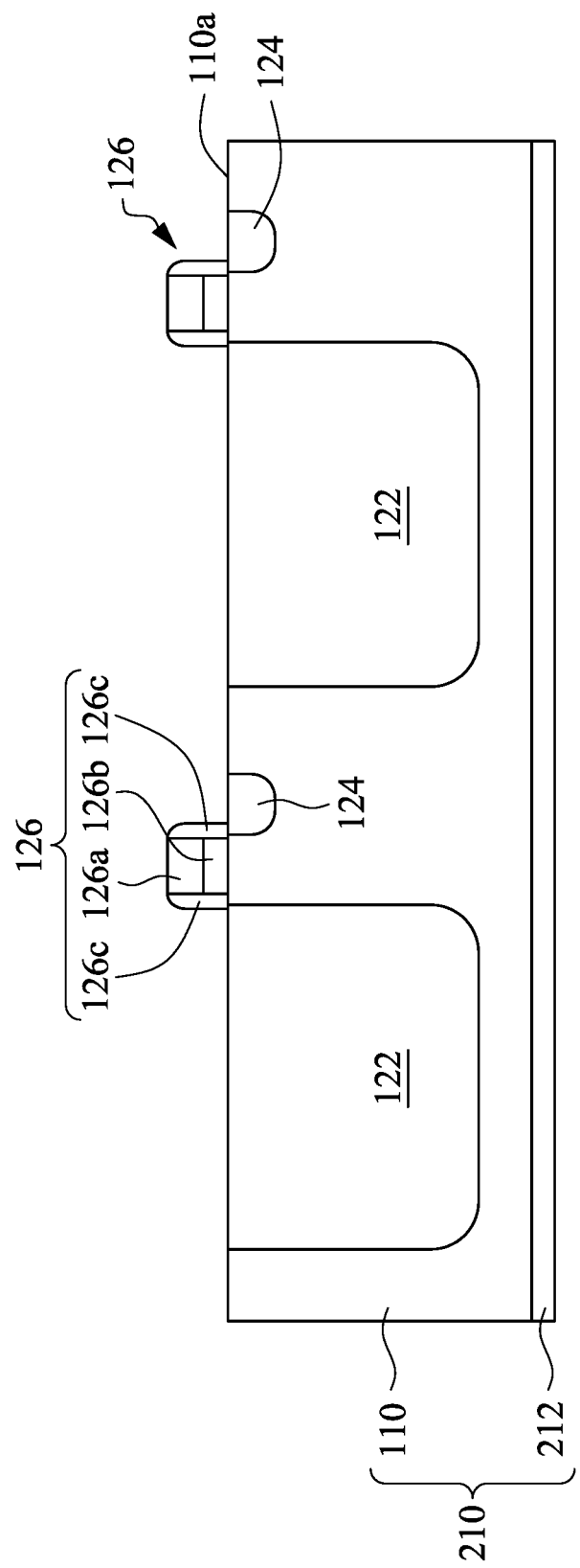
Figure 2D:
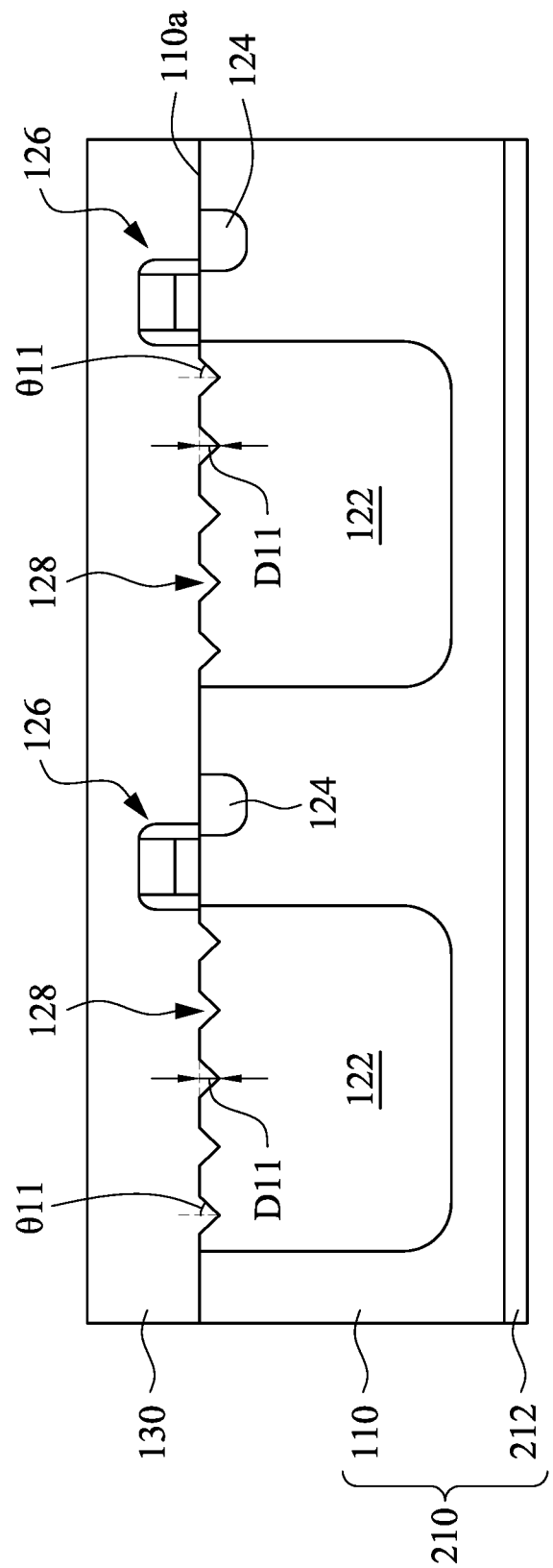
Figure 2F:
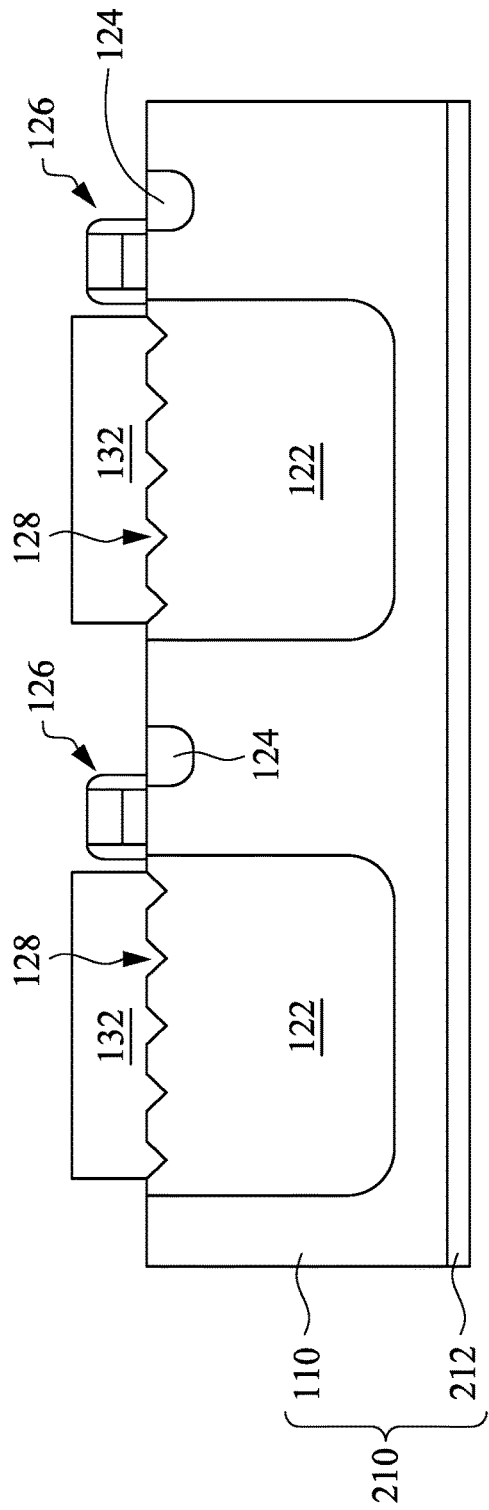
Figure 2G:
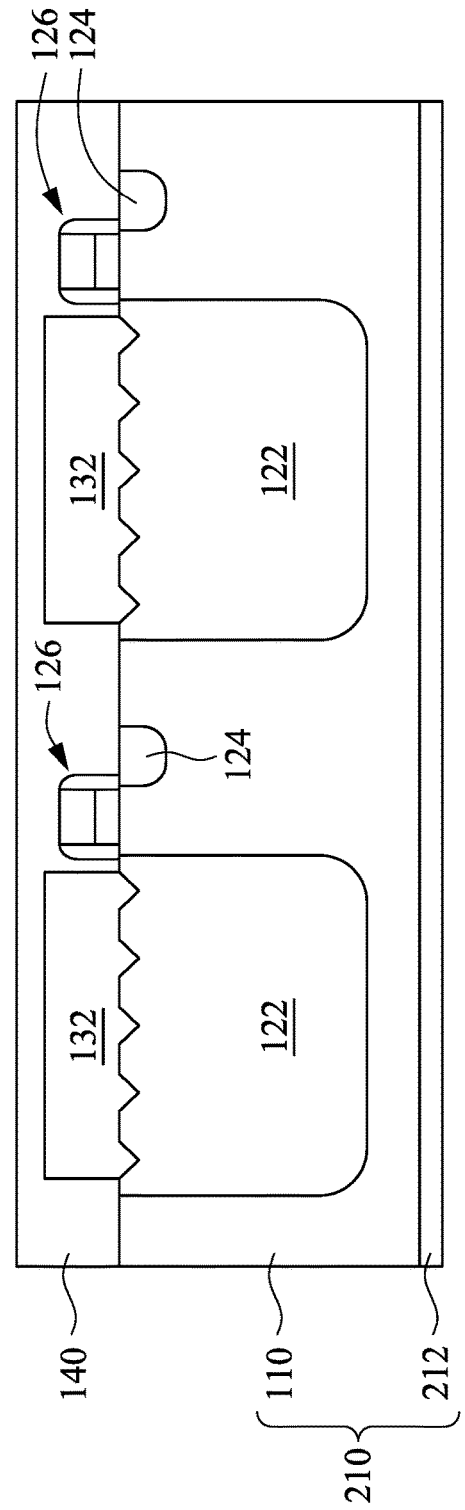
Figure 2H:
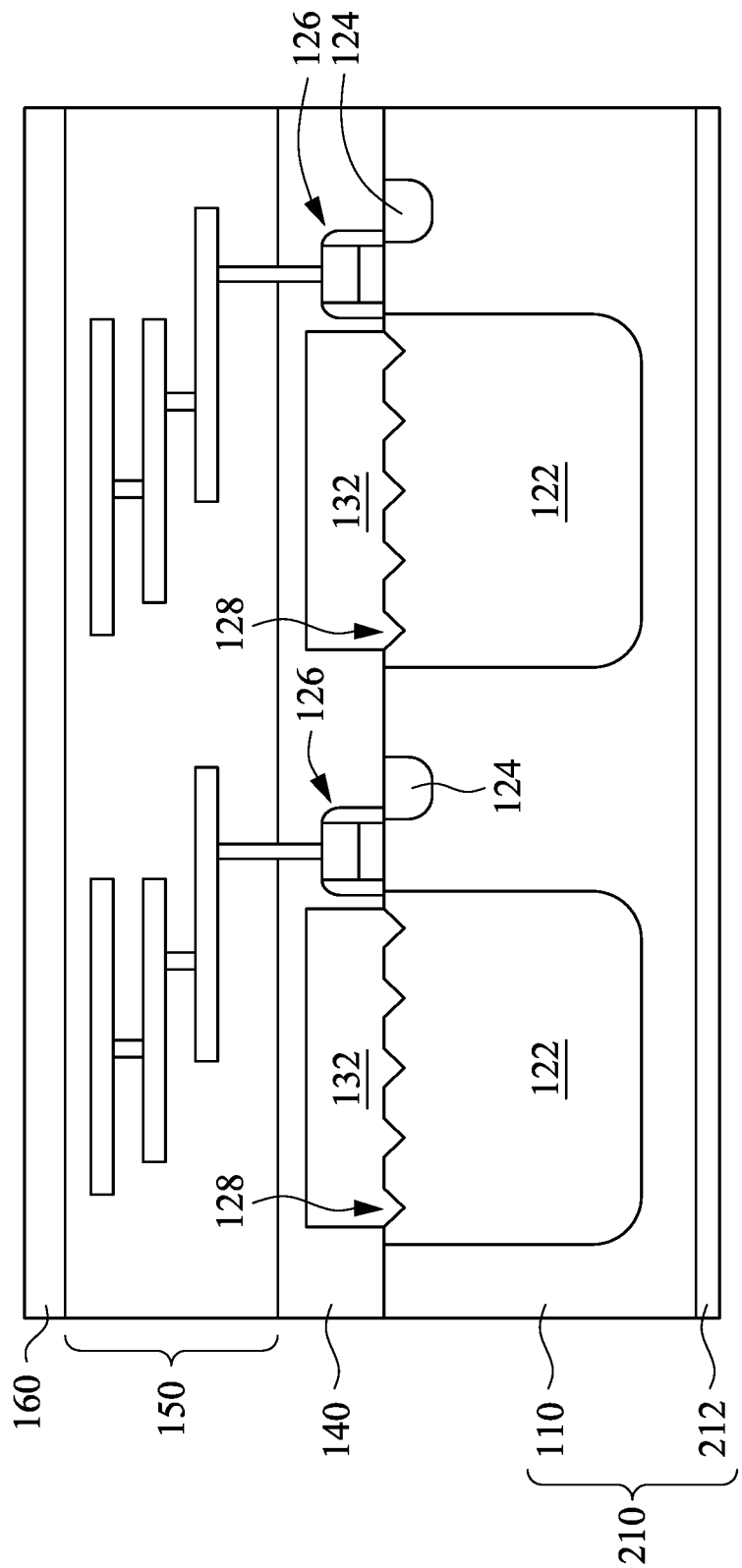
Figure 2I:
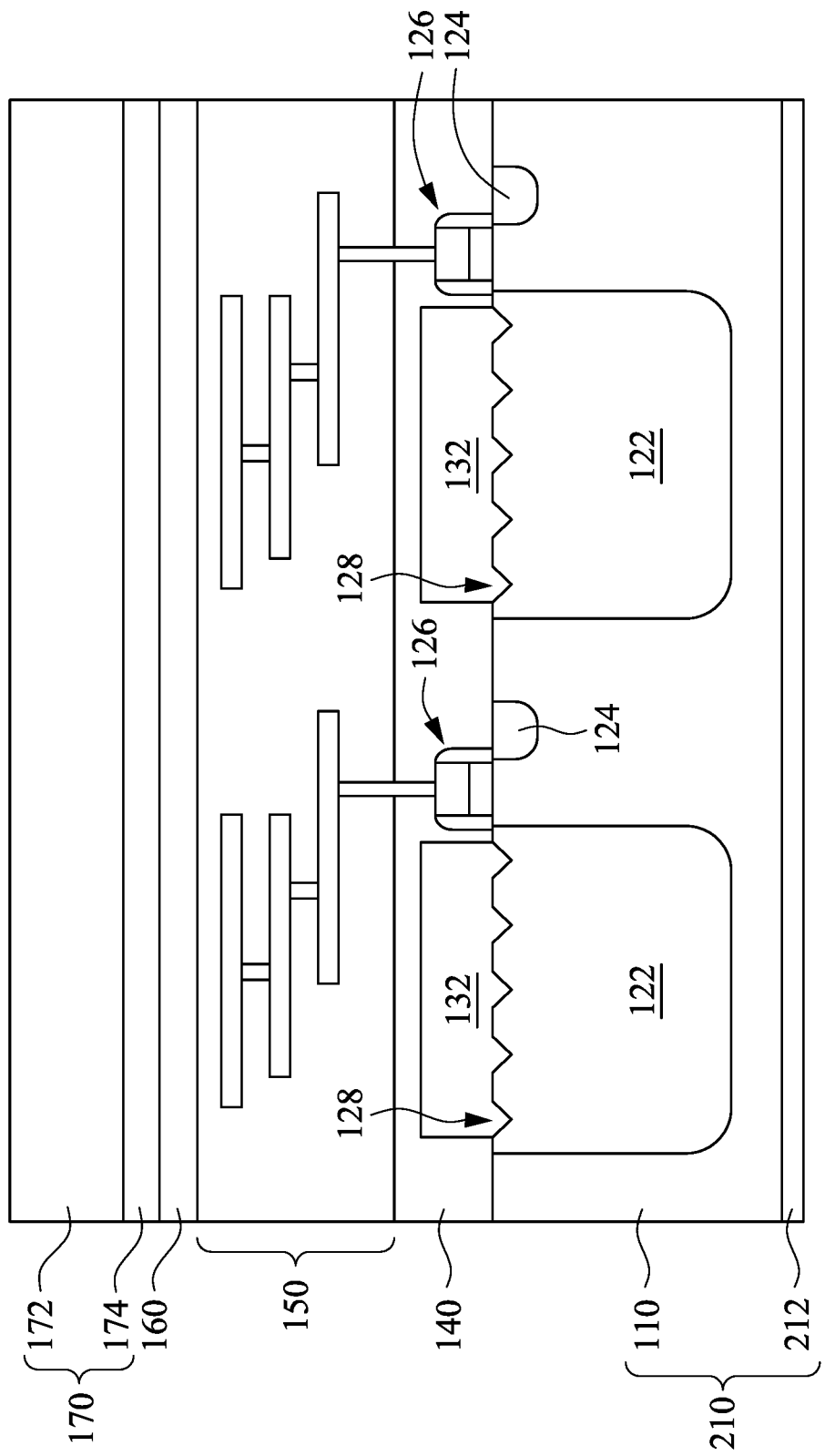
Figure 2J:
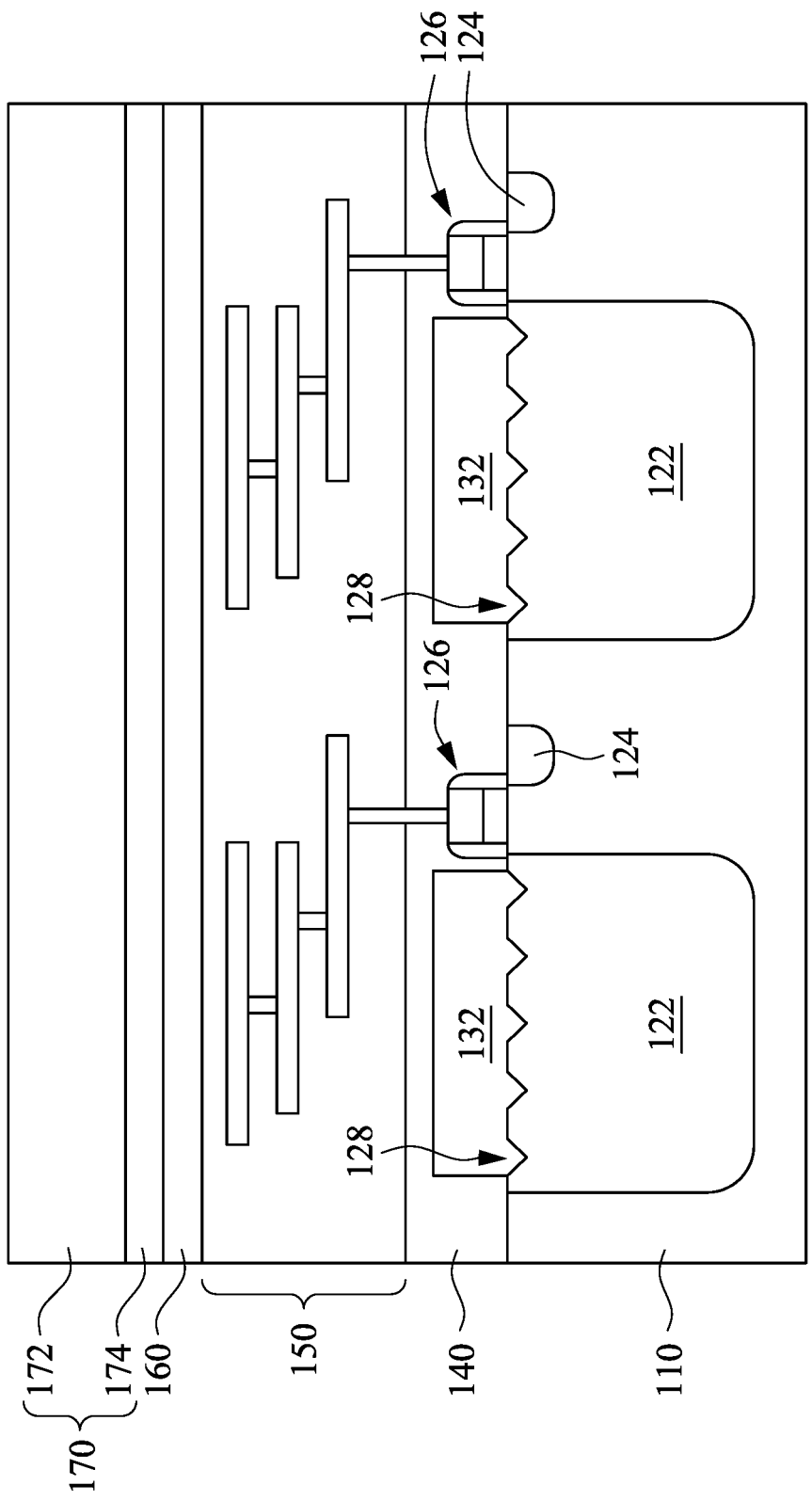
Figure 2K:
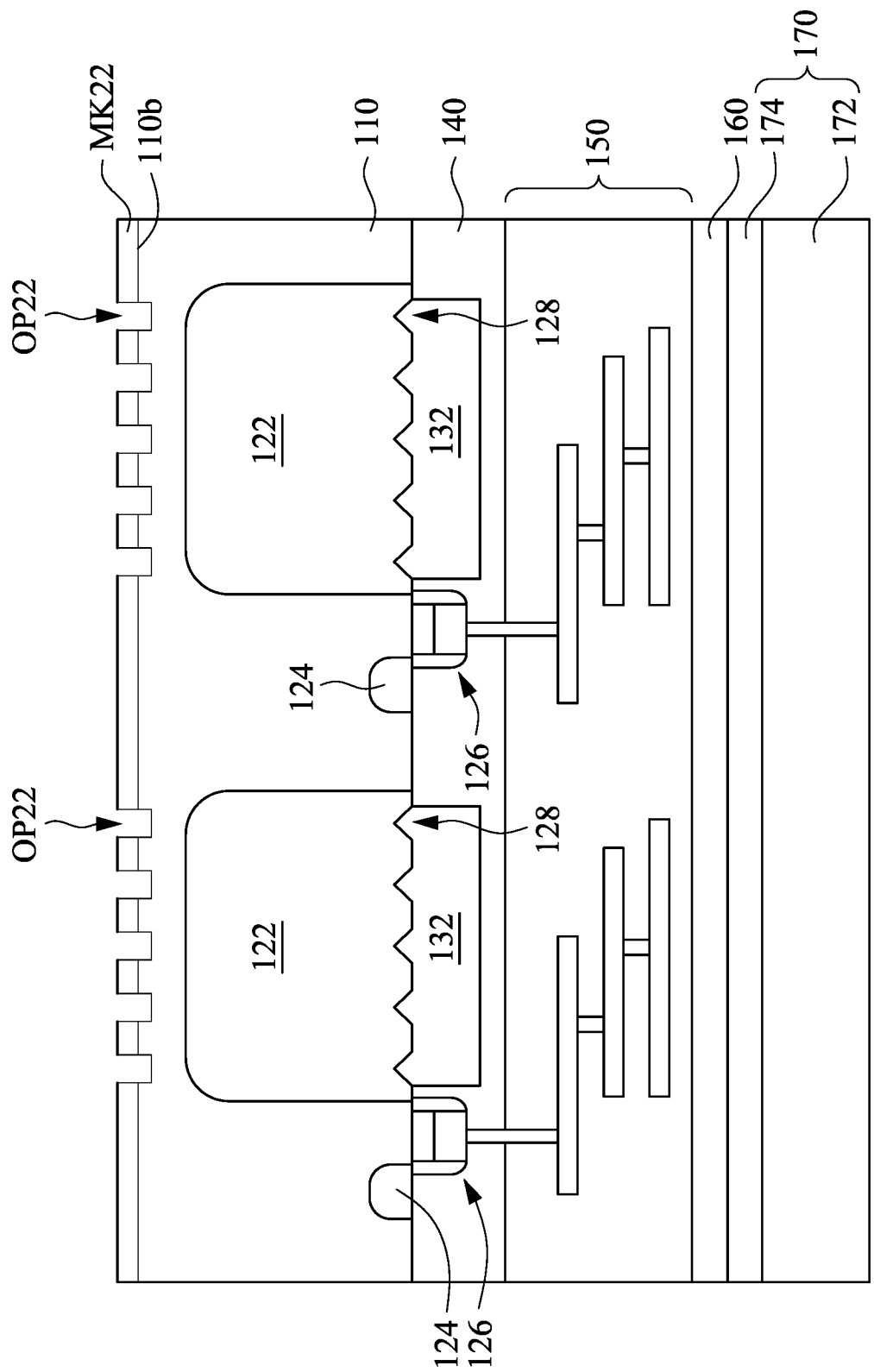
Figure 2M:
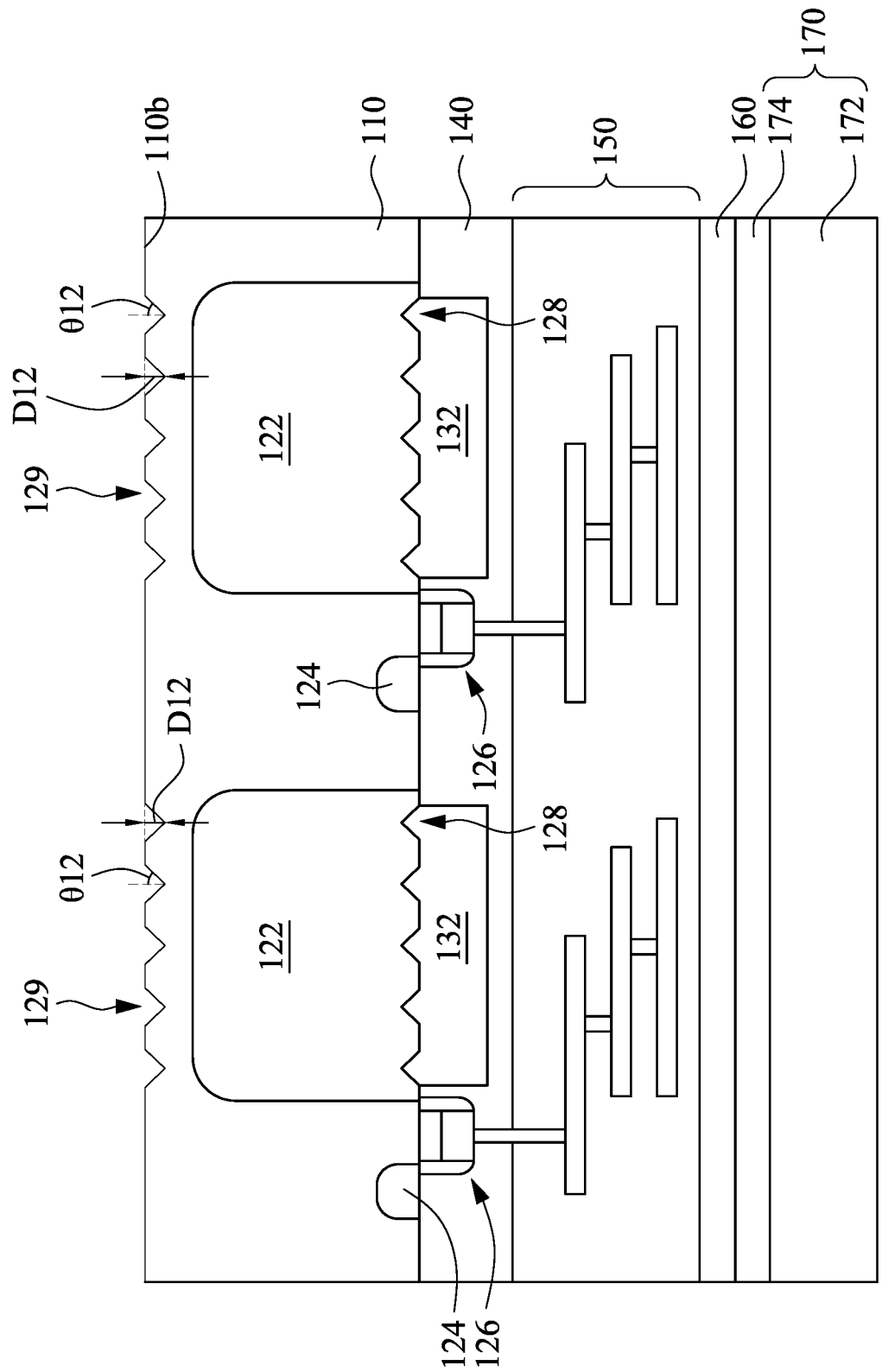
Figure 2N:
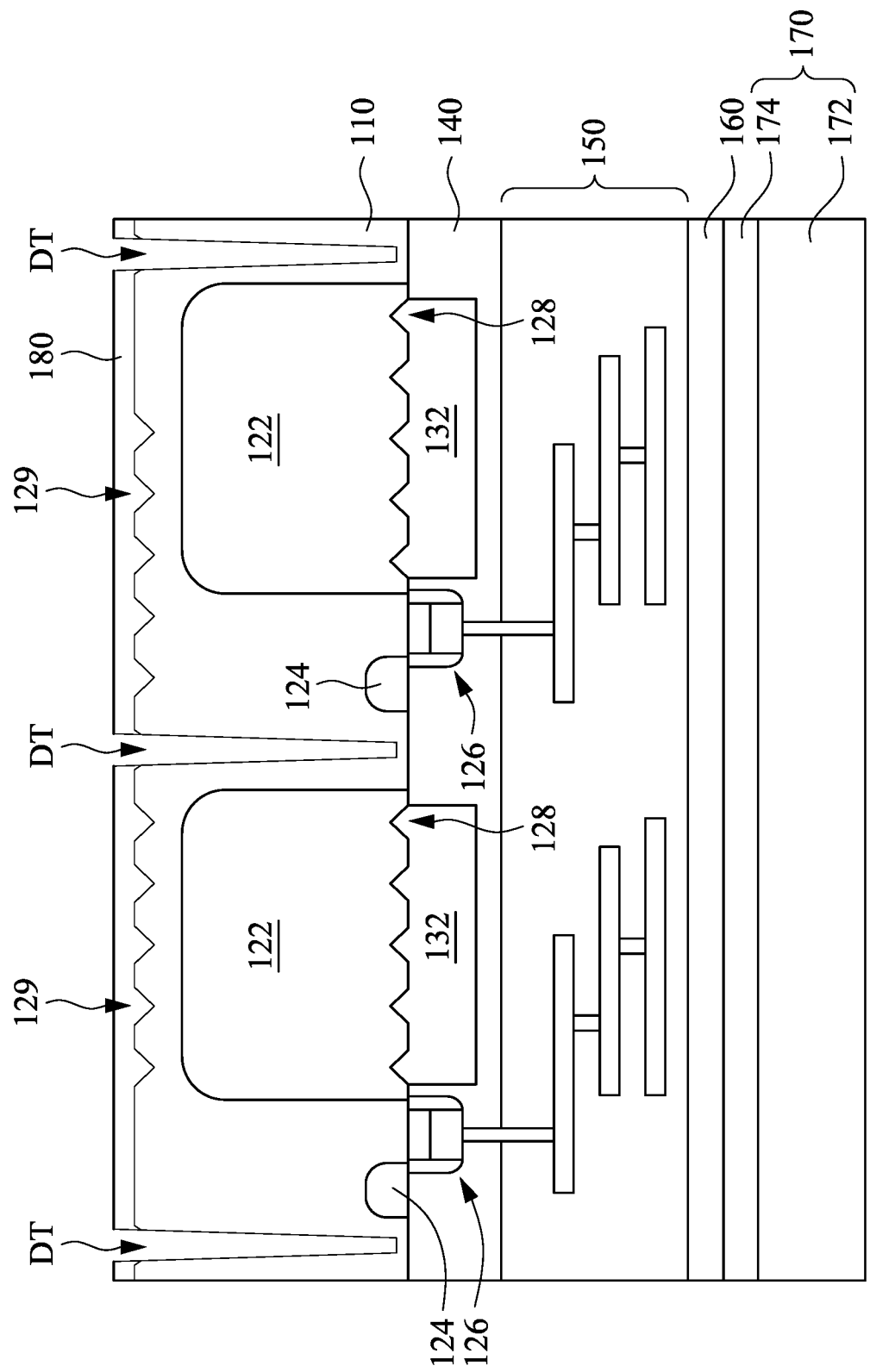
Figure 2O:
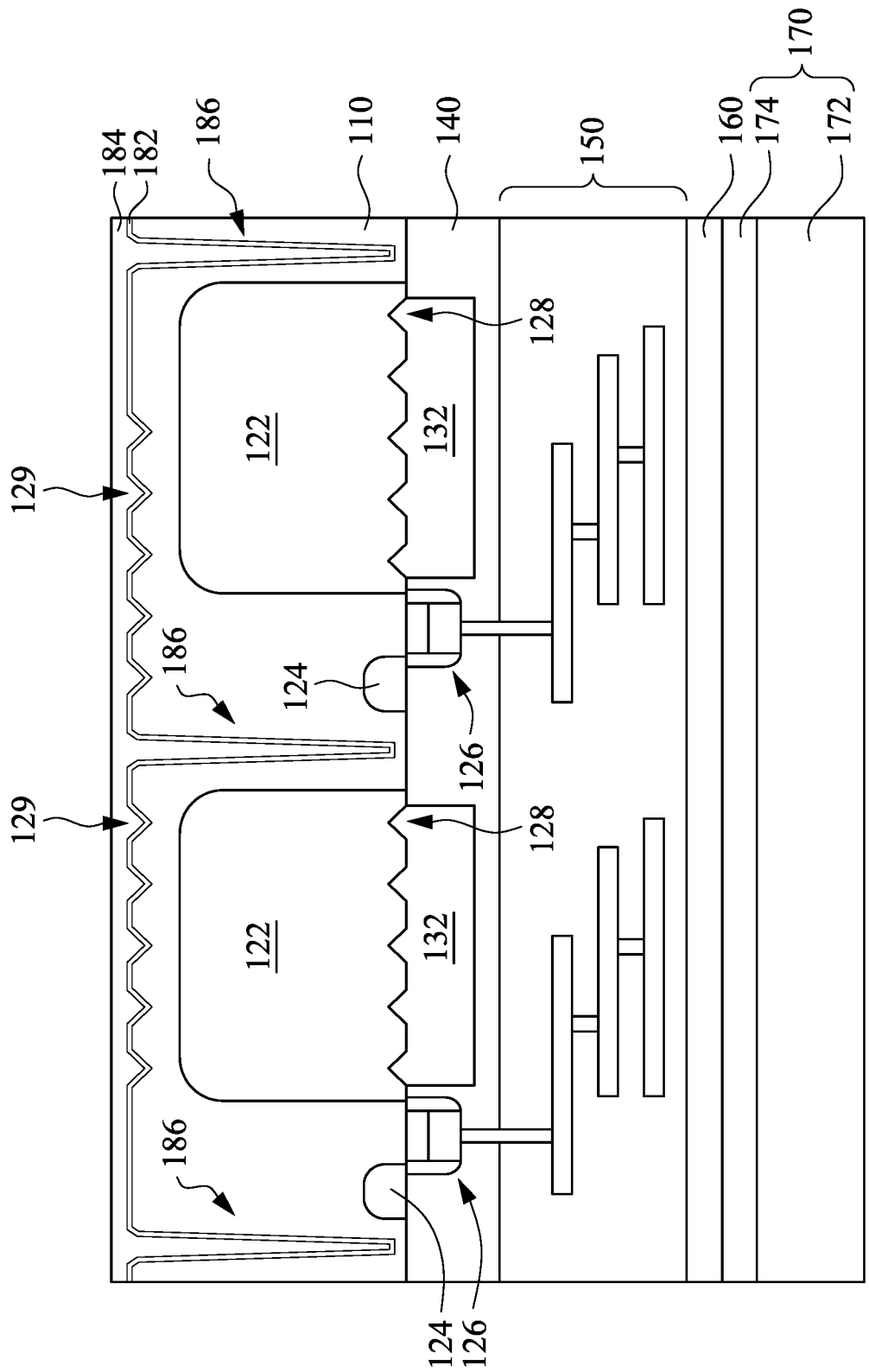
Figure 2P:
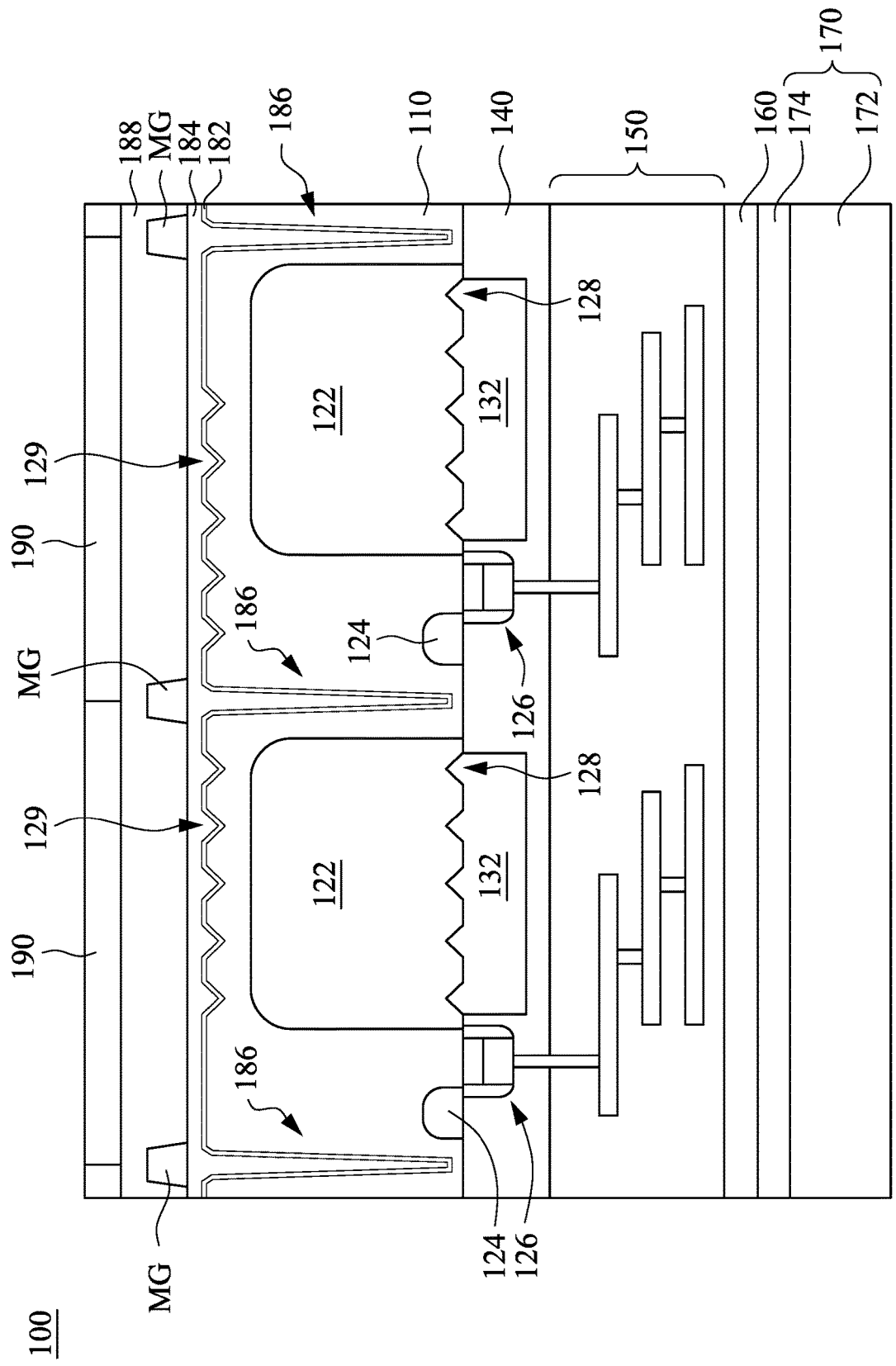

Referring to FIG. 2A to FIG. 2P and FIG. 5A to 5B, FIG. 5A to FIG. 5B are flow charts of a method 500 for fabricating an image sensor in accordance with some embodiments of the present disclosure, and FIG. 2A to FIG. 2P are cross-sectional views of intermediate stages showing the method 200 for fabricating an image sensor in accordance with some embodiments of the present disclosure. The method 500 includes a front-side stage 510 for forming front-side structures and a back-side stage 540 for forming back-side structures. At operation 501, a substrate 210 is provided, as shown in FIG. 2A. In some embodiments, the substrate 210 includes a semiconductor wafer 212 and the epitaxy layer 110. In some embodiments, the epitaxy layer 110 is a silicon layer epitaxially grown on the semiconductor wafer 212.

Then, the front-side stage 510 including operations 510a to 510j is performed. At operation 510a, the epitaxy layer 110 is doped to form the light-sensitive regions 122 and the floating nodes 124, as shown in FIG. 2B. In some embodiments, a first surface 110a of the epitaxy layer 110 is doped with an n-type dopant to form the light-sensitive regions 122 and the floating nodes 124. At operation 510b, the transfer gates structures 126 are formed on the first surface 110a of the epitaxy layer 110, as shown in FIG. 2C. Specifically, the transfer gates structures 126 are formed between the light-sensitive regions 122 and the floating nodes 124. At operation 510c and operation 510d, the first surface 110a of the epitaxy layer 110 is etched to form the recess structures 128 on the light-sensitive regions 122 and then a light-reflective material layer 130 is formed on the first surface 110a of the epitaxy layer 110, as shown in FIG. 2D. In some embodiments, the first surface 110a of the epitaxy layer 110 is etched by using a wet etching operation with different etching rates in crystal directions (100) and (110), such that the recess structures 228 are formed to have the shape of inverted pyramid.

In some embodiments, the light-reflective material layer 130 covers the light-sensitive regions 122, the floating nodes 124 and the transfer gates structures 126. In some embodiments, the light-reflective material layer 130 is a metal layer formed by using a deposition operation such as chemical vapor deposition (CVD), plasma enhanced chemical vapor deposition (PECVD), atomic layer deposition (ALD), plasma enhanced atomic layer deposition (PEALD), other suitable deposition operations, or combinations thereof.

In some embodiments, as shown in FIG. 2D', the liners 142 can be formed on each of the recess structures 128 of the first surface 110a after the first surface 110a is etched to form the recess structures 128. Because the recess structures 128 are formed by etching the first surface 110a, there may be dangling bonds or defects on the recess structures 128. The liners 142 formed on the recess structures 128 are capable of removing the dangling bonds or defects. In some embodiments, the liners 142 are formed by using a deposition operation such as chemical vapor deposition (CVD), plasma enhanced chemical vapor deposition (PECVD), atomic layer deposition (ALD), plasma enhanced atomic layer deposition (PEALD), other suitable deposition operations, or combinations thereof.

At operation 510e and operation 510f, the light-reflective material layer 130 is polished to decrease a height of the light-reflective material layer 130, and mask layers MK21 are formed on the light-reflective material layer 130, as shown in FIG. 2E. In some embodiments, the light-reflective material layer 130 is polished by using chemical mechanical polishing (CMP). After being polished, the light-reflective material layer 130 has a height slightly higher than a height of the transfer gates structures 126. In some embodiments, the mask layers MK21 are formed corresponding to the light-sensing regions 122. In some embodiments, the mask layers MK21 cover most area of the light-sensing regions 122.

At operation 510g, the light-reflective material layer 130 is etched by using the mask layers MK21 to form the light-reflective layers 132 on the recess structures 128 of the light-sensing regions 122, as shown in FIG. 2F. In some embodiments, there is gap between the light-reflective layers 132 and the transfer gates structures 126, such that the light-reflective layers 132 does not contact with the transfer gates structures 126. In some embodiments, each of the light-reflective layers 132 has protrusion portions 132a filling the recess structures 128. In some embodiments, because the recess structures 128 are inverted pyramid recess arranged in a periodic structure, the protrusion portions 132a of the light-reflective layers 132 are formed to be pyramids arranged in another periodic structure.

At operation 510h, the interlayer dielectric layer 140 is formed on the first surface 110a of the substrate 210 and covers the transfer gate structures 126 and the light-reflective layers 132, as shown in FIG. 2G. In some embodiments, the interlayer dielectric layer 140 may be formed by using a deposition operation such as chemical vapor deposition (CVD), plasma enhanced chemical vapor deposition (PECVD), atomic layer deposition (ALD), plasma enhanced atomic layer deposition (PEALD), other suitable deposition operations, or combinations thereof. At operation 510i and operation 510j, the BEOL metallization stack 150 and the passivation layer 160 are sequentially formed on the interlayer dielectric layer 140, as shown in FIG. 2H. In some embodiments, the passivation layer 160 is formed by using a deposition operation such as chemical vapor deposition (CVD), plasma enhanced chemical vapor deposition (PECVD), atomic layer deposition (ALD), plasma enhanced atomic layer deposition (PEALD), other suitable deposition operations, or combinations thereof.

Then, at operation 520, the carrier 170 is provided and the passivation layer 160 is bonded on the carrier 170, as shown in FIG. 2I. At operation 530, a thin down operation is conducted on the substrate 210 to decrease a thickness of the substrate 210, as shown in FIG. 2J. In some embodiments, the substrate 210 is thinned down by using a mechanical grinding process and a chemical thinning process. For example, a substantial amount of substrate material may be first removed from the substrate 210 during the mechanical grinding process. Afterwards, the chemical thinning process may apply an etching chemical to the substrate 210 to further thin the substrate 210. In some embodiments, the substrate 210 is thinned down to have a thickness from about 6 μm to about 10 μm.

Then, the back-side stage 540 including operations 540a to 540k is performed. At operation 540a and operation 540b, a hard mask MK22 is formed on the second surface 110b of the epitaxy layer 110 and then patterned to have openings OP22, as shown in FIG. 2K, in which the second surface 110b is opposite to the surface 110a. In some embodiments, the hard masks MK22 may include silicon nitride or silicon oxynitride. In some embodiments, the hard mask MK22 is patterned by using dry etching, and the second surface 110b of the epitaxy layer 110 maybe etched unintentionally. In some embodiments, the openings OP22 are formed corresponding to the light-sensing regions 122.

At operation 540c and operation 540d, the second surface 110b of the epitaxy layer 110 is etched to form the recess structures 129 on the light-sensing regions 122 and then the hard mask MK22 is removed, as shown in FIG. 2L and FIG. 2M. In some embodiments, the second surface 110b of the epitaxy layer 110 is etched by using a wet etching operation with different etching rates in crystal directions (100) and (110), such that the recess structures 129 are formed to have the shape of inverted pyramid.

Figure 3:
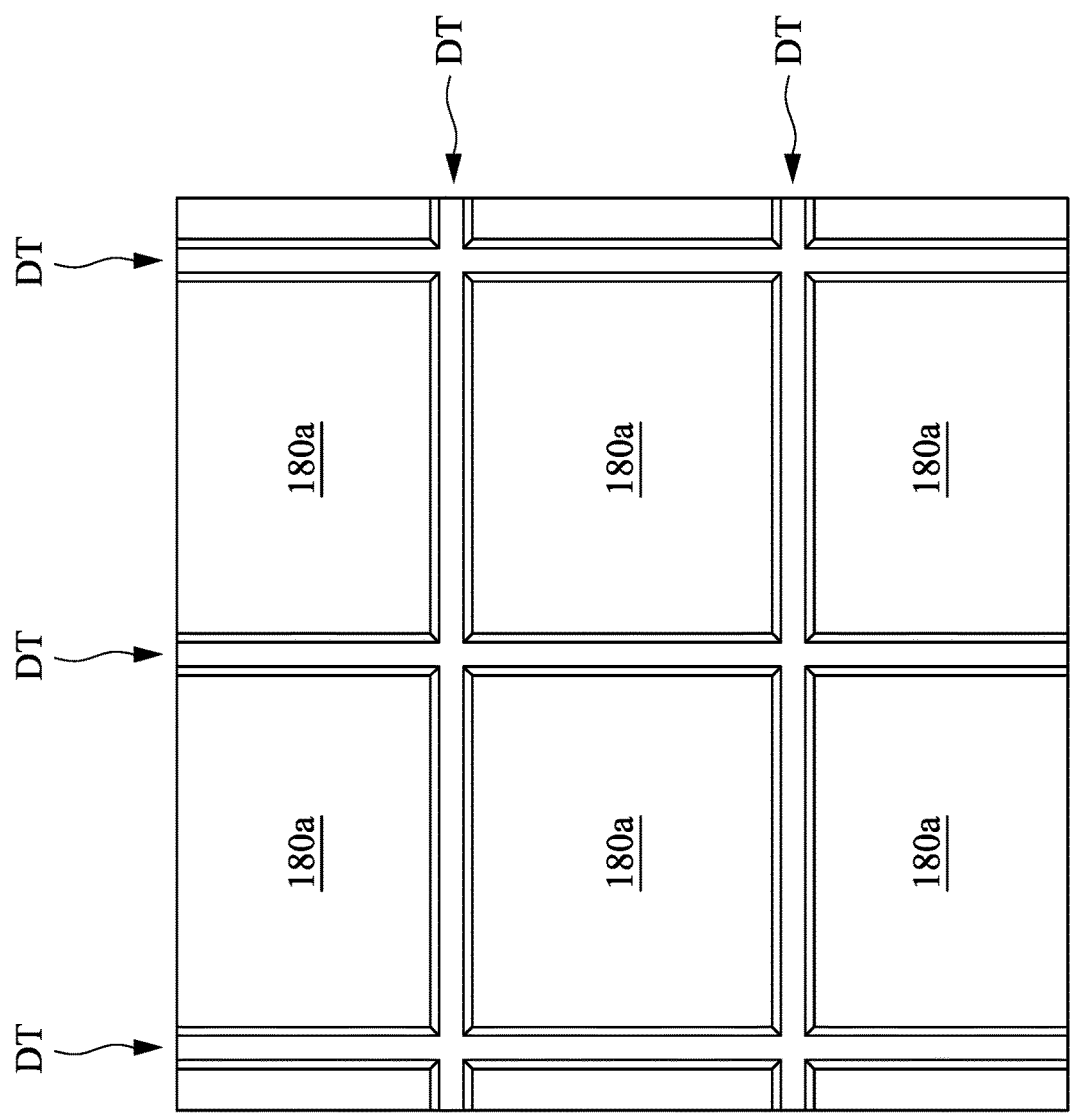
FIG. 3 is a schematic top view of deep trenches in accordance with some embodiments of the present disclosure.

At operation 540e and operation 540f, a sacrificial layer 180 is formed on the second surface 110b of the epitaxy layer 110 and then the epitaxy layer 110 is etched to form deep trenches DT in the epitaxy layer 110, as shown in FIG. 2N. In some embodiments, the sacrificial layer 180 includes oxide such as silicon oxide, and may be formed by using vapor deposition, thermal oxidation, spin coating, or any other suitable deposition technique. In some embodiments, each of the deep trenches DT is formed between adjacent two light-sensing regions 122. In some embodiments, a height HDT of the deep trench DT is equal to a value from 50% of a thickness of the epitaxy layer 110 to 100% of a thickness of the epitaxy layer 110. In other words, the deep trenches DT may pass through the epitaxy layer 110. In some embodiments, the deep trenches DT are formed in a shape of a grid, as shown in FIG. 3. FIG. 3 is a schematic top view of the deep trenches DT. The deep trenches DT divides the sacrificial layer 180 into plural sub-layers 180a corresponding to the light-sensing regions 122.

At operation 540g and operation 540h, the sacrificial layer 180 is removed, and the deep trenches DT are filled with the dielectric layers 182 and 184 to form the back-side deep trench isolations (BDTIs) 186, as shown in FIG. 2O. In some embodiments, the dielectric layers 182 and 184 may be formed using a deposition operation such as chemical vapor deposition (CVD), plasma enhanced chemical vapor deposition (PECVD), atomic layer deposition (ALD), plasma enhanced atomic layer deposition (PEALD), other suitable deposition operations, or combinations thereof.

Figure 4:
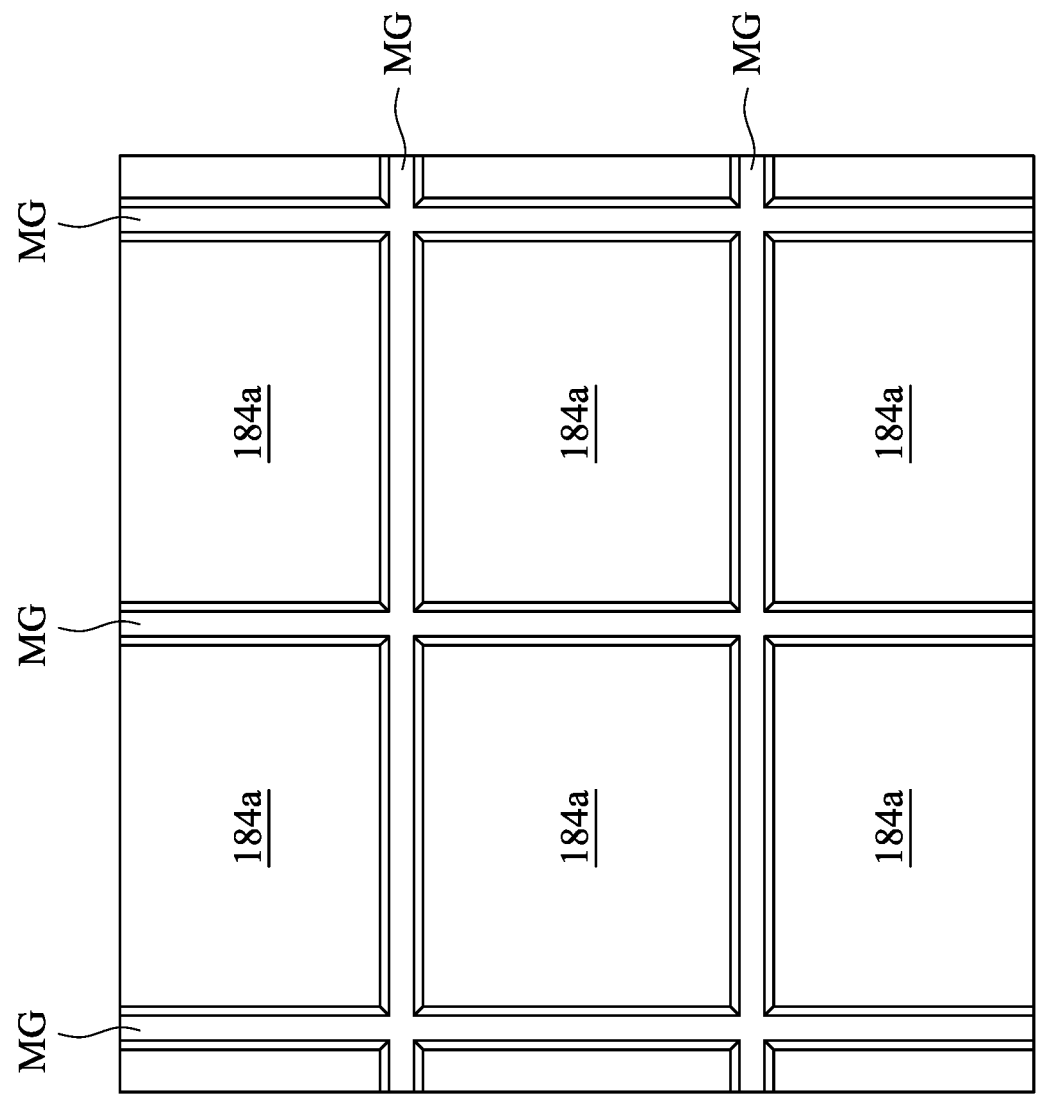
FIG. 4 is a schematic top view of a metal grid in accordance with some embodiments of the present disclosure.
Figure 5A:
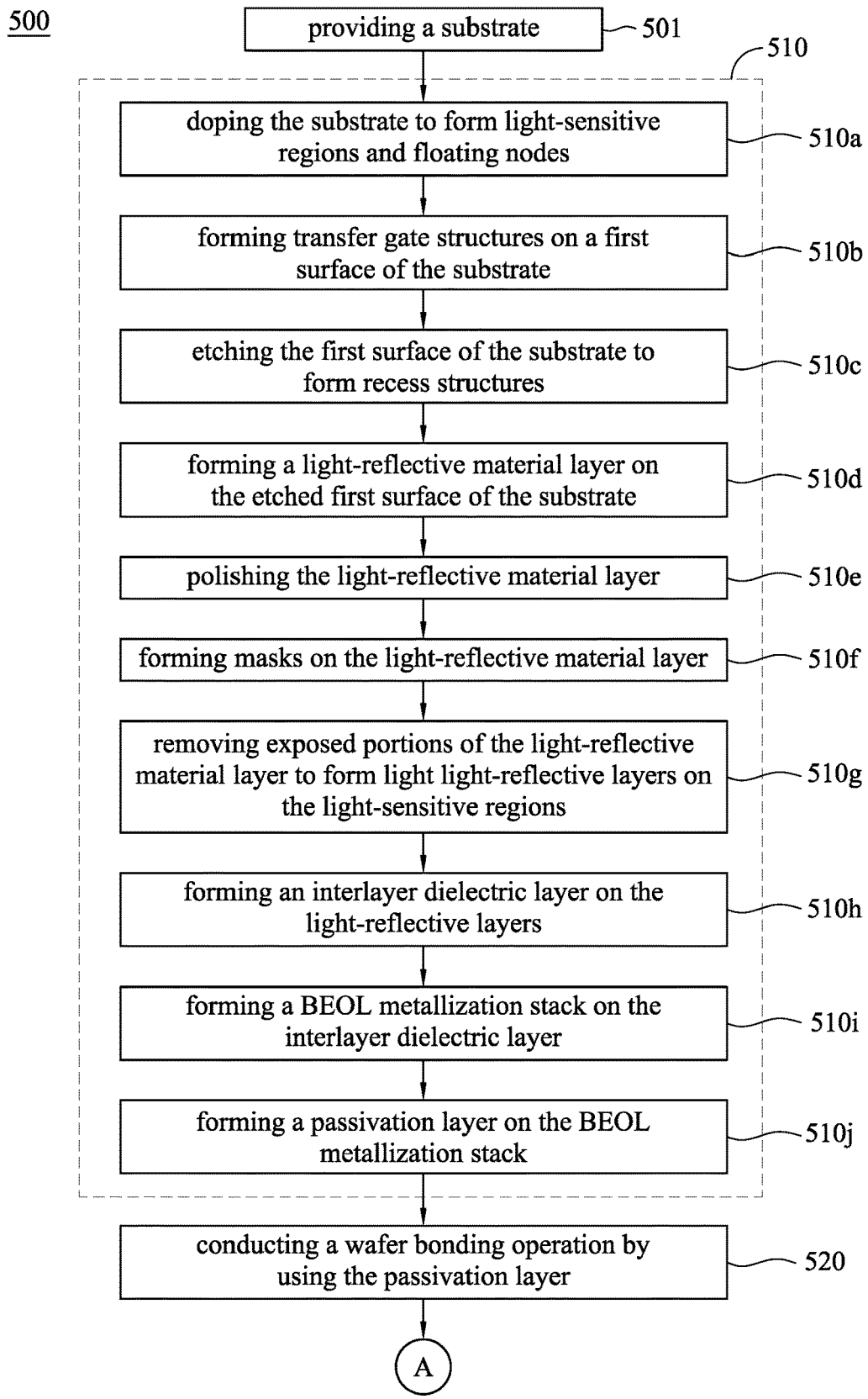
FIG. 5A to FIG. 5B are flow charts of a method for fabricating an image sensor in accordance with some embodiments of the present disclosure.
Figure 5B:
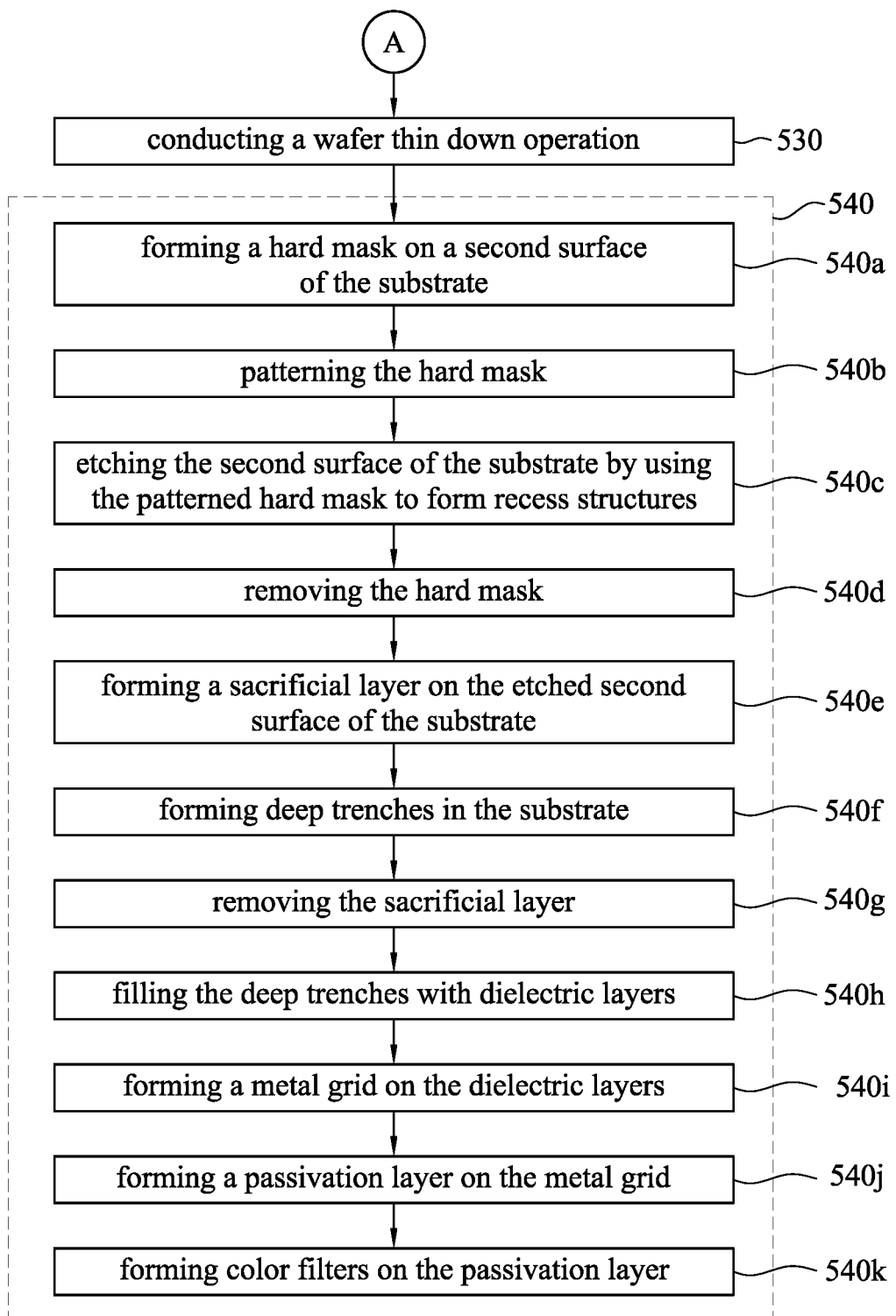

At operation 540i, operation 540j and operation 540k, the metal grid MG, the passivation layer 188 and the color filters 190 are sequentially formed on the dielectric layer 184, as shown in FIG. 2P. In some embodiments, the metal grid MG is formed corresponding to the back-side deep trench isolations 186. In some embodiments, the metal grid MG is formed by using a deposition operation and an etching operation. For example, at least one metal material layers are deposited on the dielectric layer 184, and then the at least one metal material layers are etched to form the metal grid MG. FIG. 4 is a schematic top view of the metal grid MG. The metal grid MG is formed on the dielectric layer 184 to define regions 184a of the dielectric layer 184 corresponding to the light-sensing regions 122.

In some embodiments, The passivation layer 188 may be formed using a deposition operation such as chemical vapor deposition (CVD), plasma enhanced chemical vapor deposition (PECVD), atomic layer deposition (ALD), plasma enhanced atomic layer deposition (PEALD), other suitable deposition operations, or combinations thereof. In some embodiments, the color filters 190 are formed on the passivation layer 188 corresponding to the light-sensing regions 122, and include red color filters, blue color filters and green color filters to receive red light, blue light and green light. In some embodiments, the color filters 190 are formed by using a spin-coating operation, chemical vapor deposition, or any suitable process.

Figure 6A:
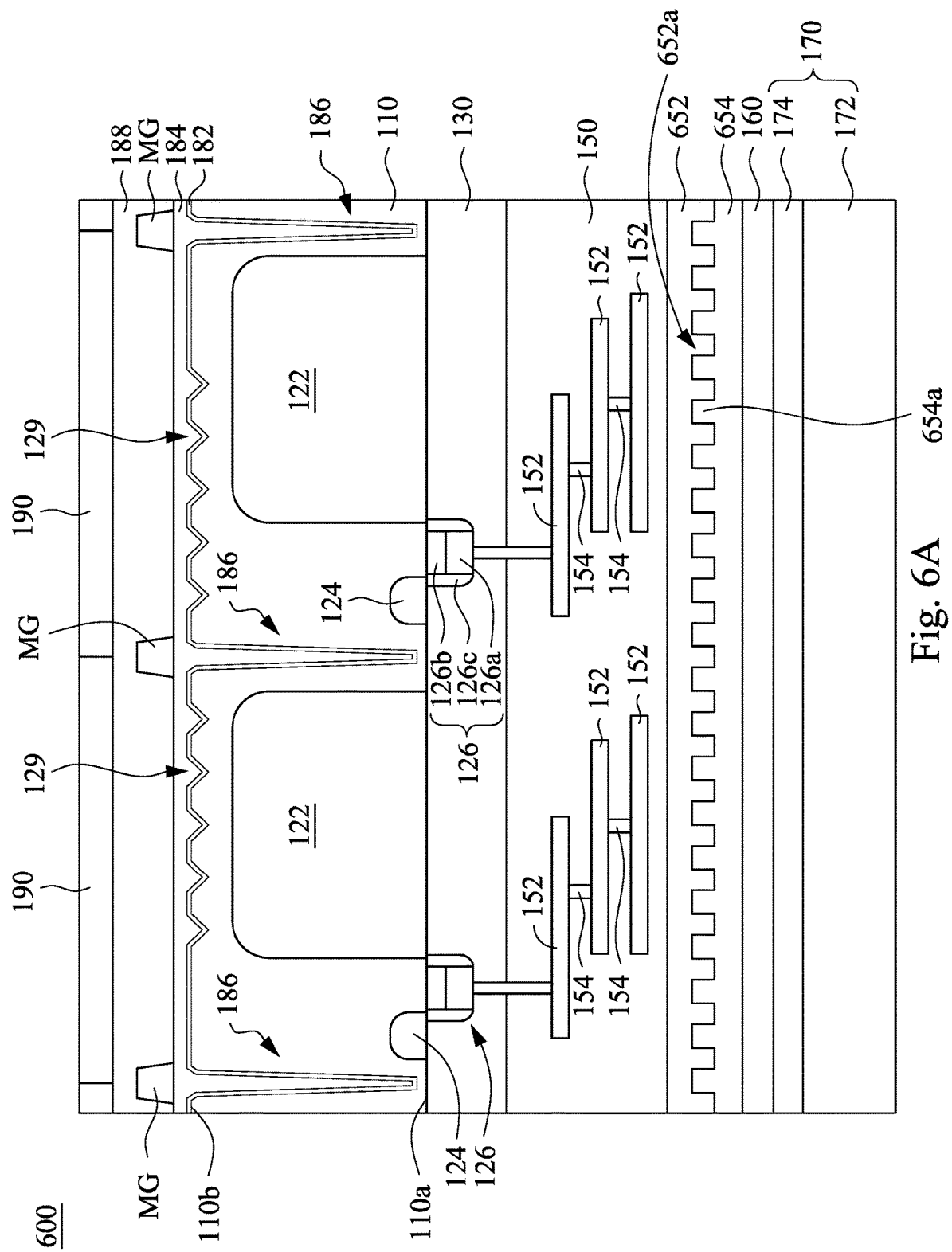
FIG. 6A is a schematic cross-sectional view of an image sensor in accordance with some embodiments of the present disclosure.

FIG. 6A is a schematic cross-sectional view of an image sensor 600 in accordance with some embodiments of the present disclosure. The image sensor 600 is similar to the image sensor 100, but the difference is in that the image sensor 600 does not include the recess structures 128 and the light-reflective layers 132, and the image sensor 600 includes a dielectric layer 652 and a light-reflective layer 654.

Figure 6B:
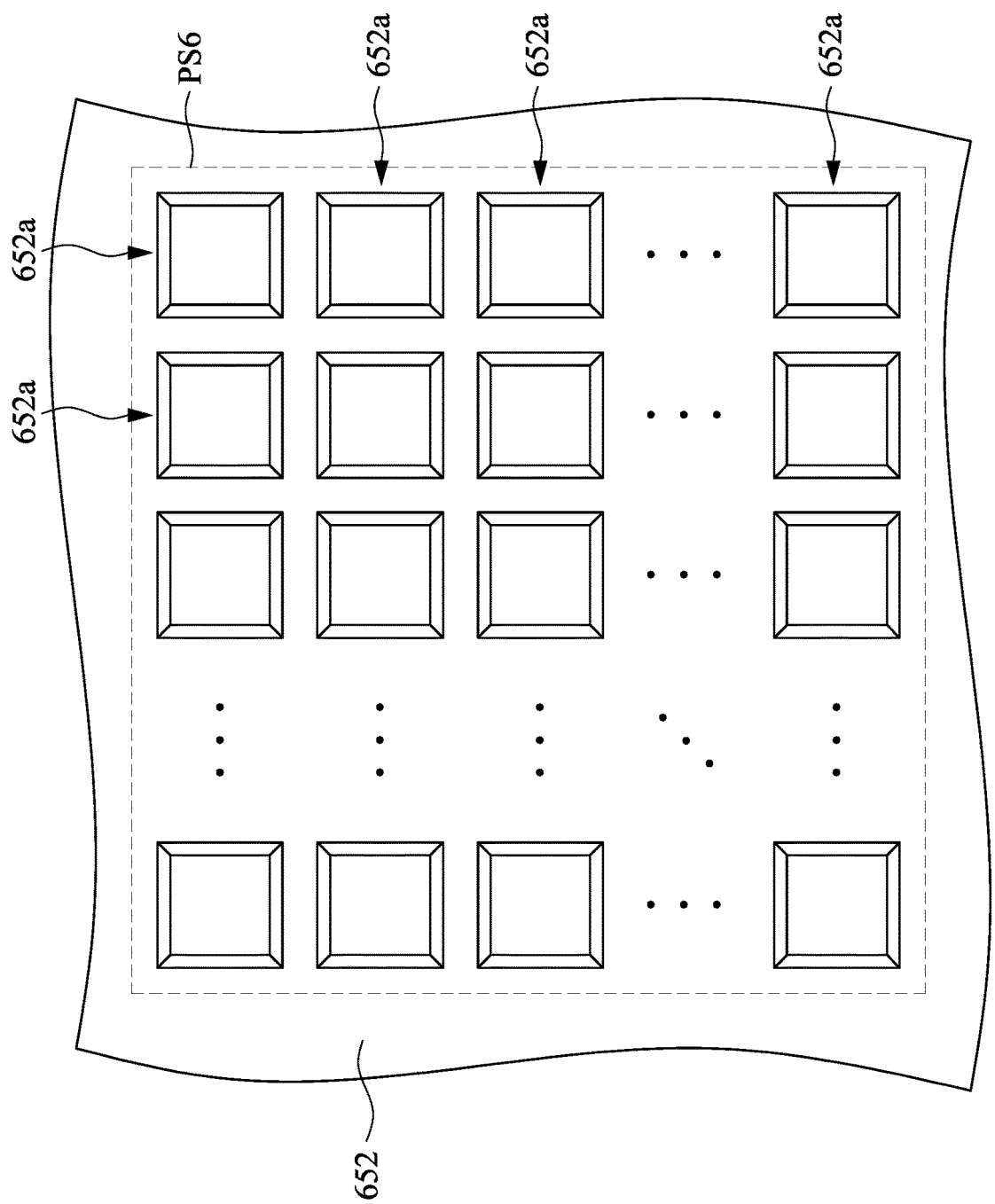
FIG. 6B is a schematic top view of the recess structures in accordance with some embodiments of the present disclosure.

The dielectric layer 652 is disposed on the BEOL metallization stack 150. The dielectric layer 652 has recess structures 652a. In some embodiments, each of the recess structures 652a is a rectangular recess as shown in FIG. 6B. FIG. 6B is a schematic top view of the recess structures 652a. The recess structures 652a are arranged to form a periodic structure PS8 on the light-sensing regions 122.

The light-reflective layer 654 is disposed on the recess structures 652a of the dielectric layer 652. In some embodiments, the light-reflective layer 654 has protrusion portions 654a matching with the recess structures 652a. In some embodiments, because the recess structures recess structures 652a are rectangular recesses arranged in a periodic structure, the protrusion portions 654a of the light-reflective layer 654 are cubes arranged in another periodic structure. In some embodiments, the light-reflective layer 654 includes metal for light reflection. In some embodiments, the dielectric layer 652 may be, for example, silicon dioxide, silicon nitride, a low k dielectric (e.g., fluorosilicate glass (FSG)), some other dielectric, or a combination of the foregoing. The protrusion portions 654a of the light-reflective layer 654 are capable of increasing the light paths of the light passing through the light-sensing regions 122 when the light is reflected by the protrusion portions 654a of the light-reflective layer 654, thereby improving the QE of the image sensor 600.

Figure 7C:
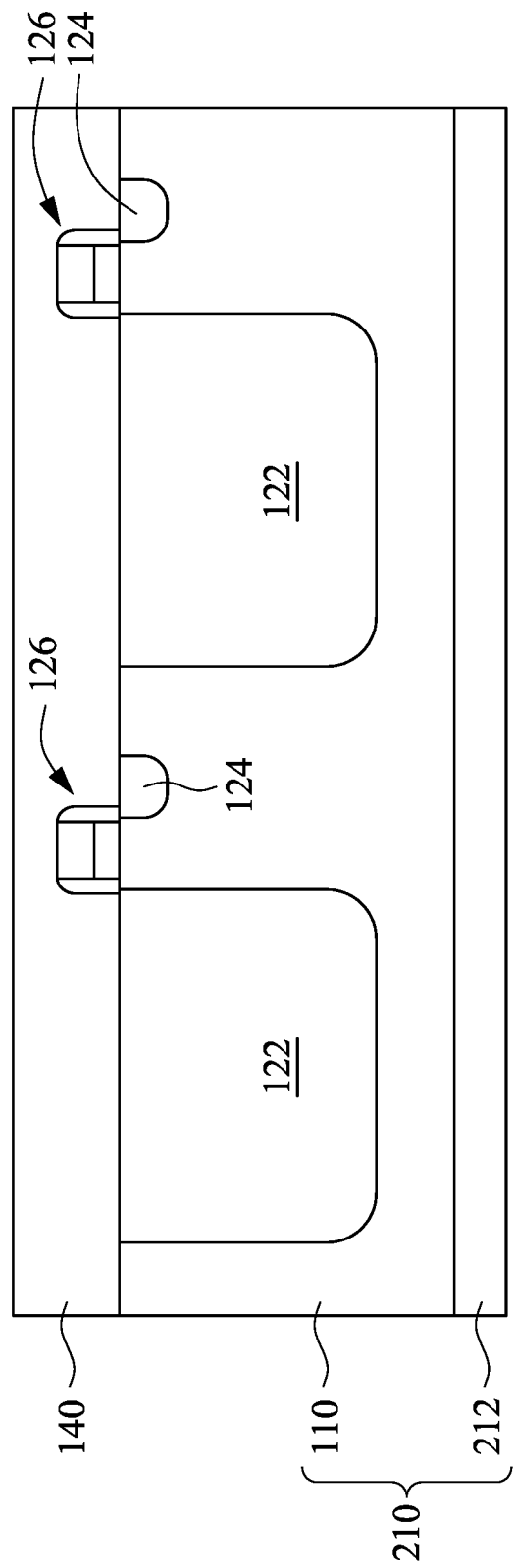

Referring to FIG. 7A to FIG. 7I and FIG. 8, FIG. 8 is a flow chart of a method 800 for fabricating an image sensor in accordance with some embodiments of the present disclosure, and FIG. 7A to FIG. 7I are cross-sectional views of intermediate stages showing the method 800 for fabricating an image sensor in accordance with some embodiments of the present disclosure. The method 800 includes a front-side stage 810 for forming front-side structures and the back-side stage 540 for forming back-side structures. At operation 801, the substrate 210 having the epitaxy layer 110 is provided, as shown in FIG. 7A.

Figure 7D:
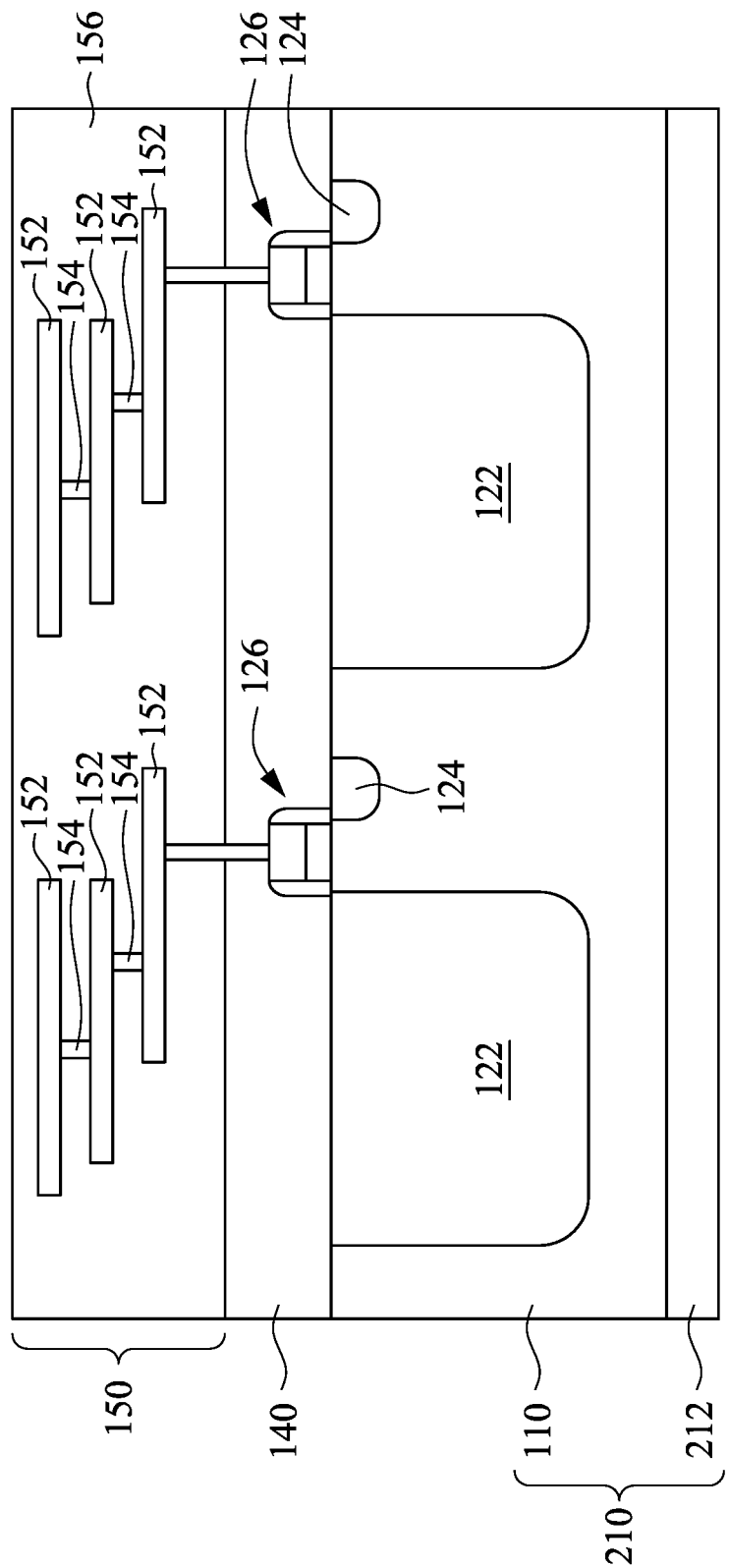

Then, the front-side stage 810 including operations 1010a to 1010h is performed. At operation 810a and operation 810b, the epitaxy layer 110 is doped to form the light-sensitive regions 122 and the floating nodes 124, and the transfer gates structures 126 are formed on the first surface 110a as shown in FIG. 7B. At operation 810c, the interlayer dielectric layer 140 is formed on the transfer gates structures 126, as shown in FIG. 7C. At operation 810d, the BEOL metallization stack 150 is formed on the interlayer dielectric layer 140, as shown in FIG. 7D.

Figure 7E:
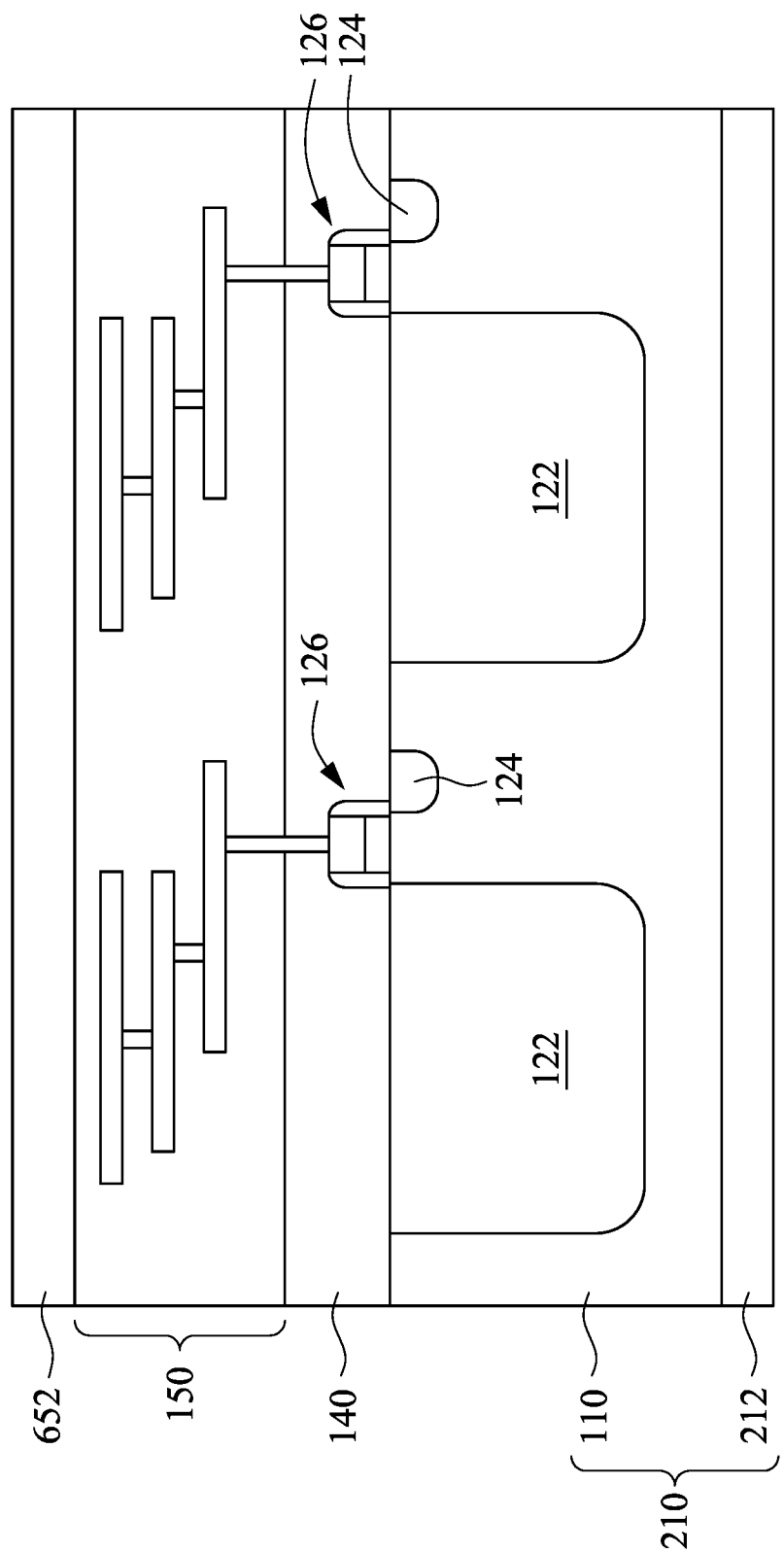

At operation 810e, the dielectric layer 652 is formed on the BEOL metallization stack 150, as shown in FIG. 7E. In some embodiments, the dielectric layer 652 is formed by using a deposition operation such as chemical vapor deposition (CVD), plasma enhanced chemical vapor deposition (PECVD), atomic layer deposition (ALD), plasma enhanced atomic layer deposition (PEALD), other suitable deposition operations, or combinations thereof.

Figure 7F:
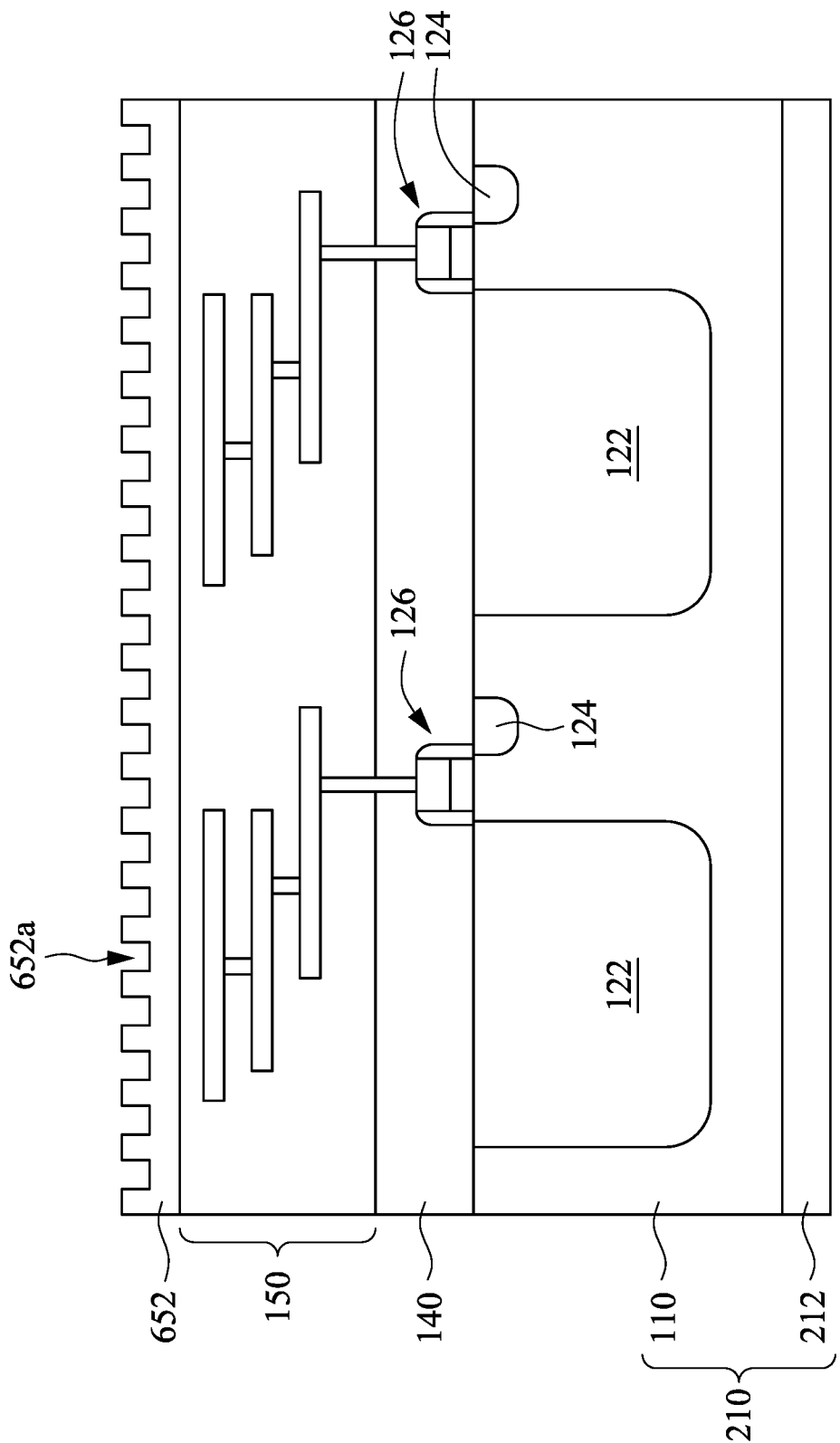
Figure 7G:
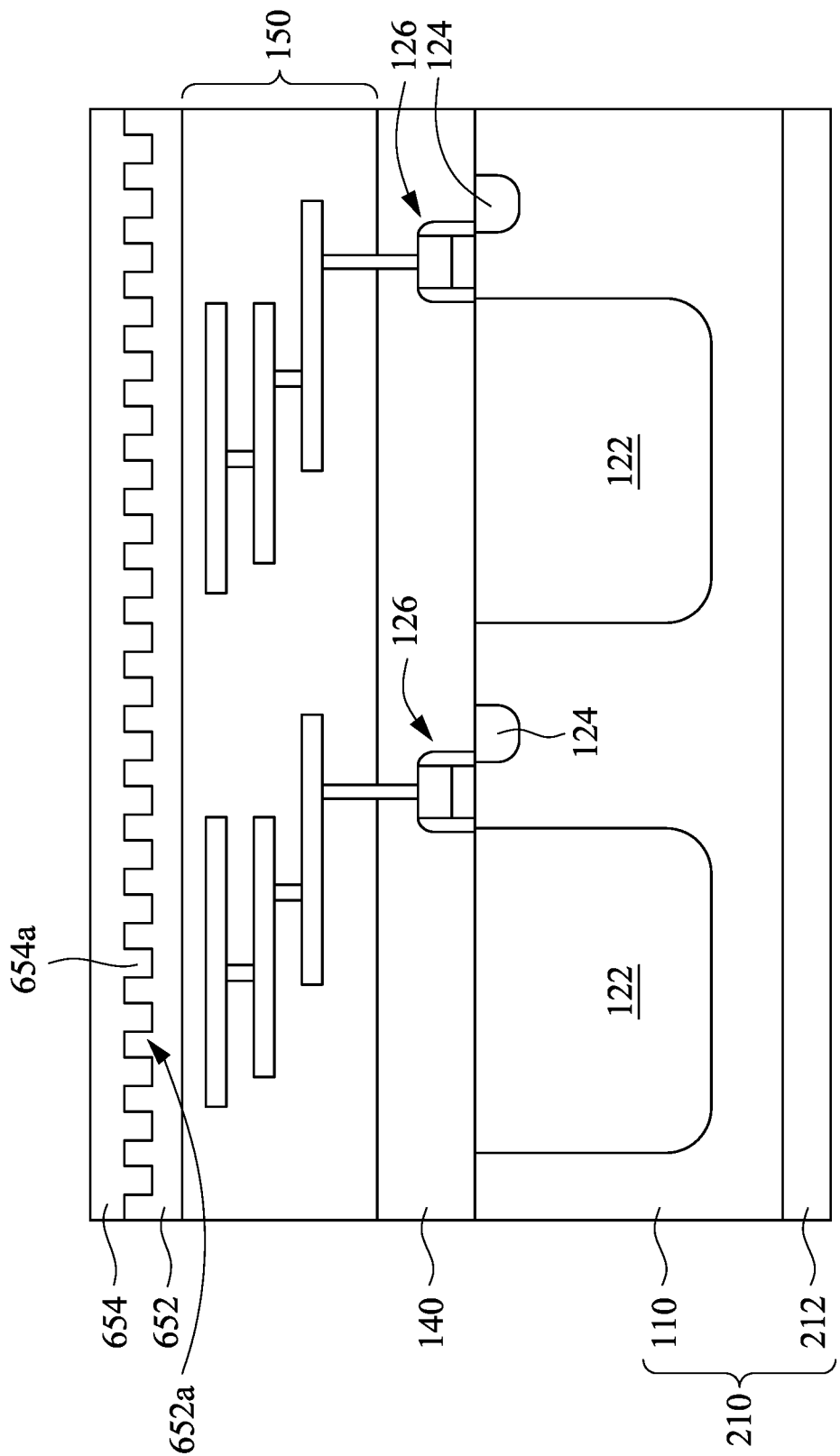
Figure 7H:
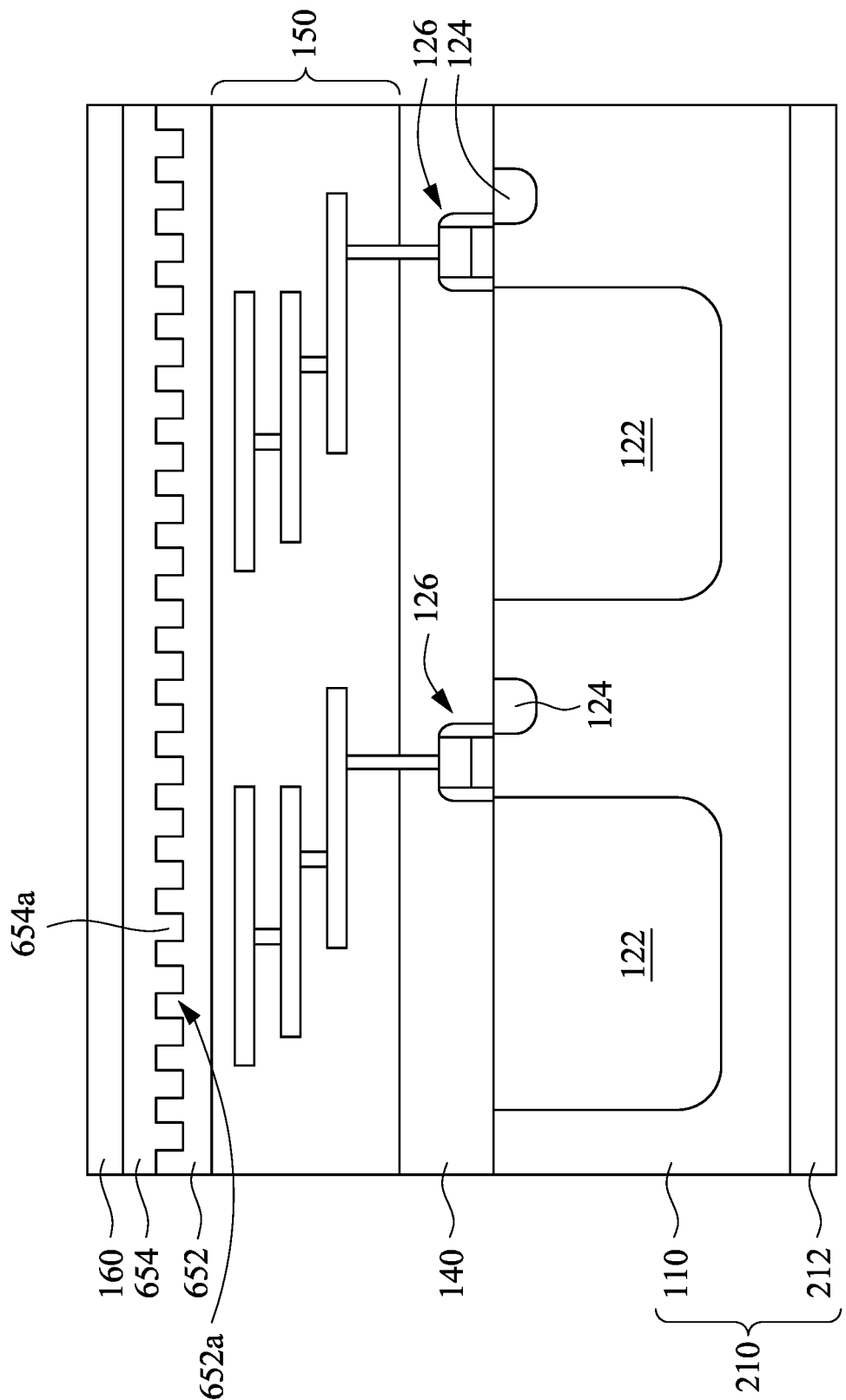
Figure 7I:
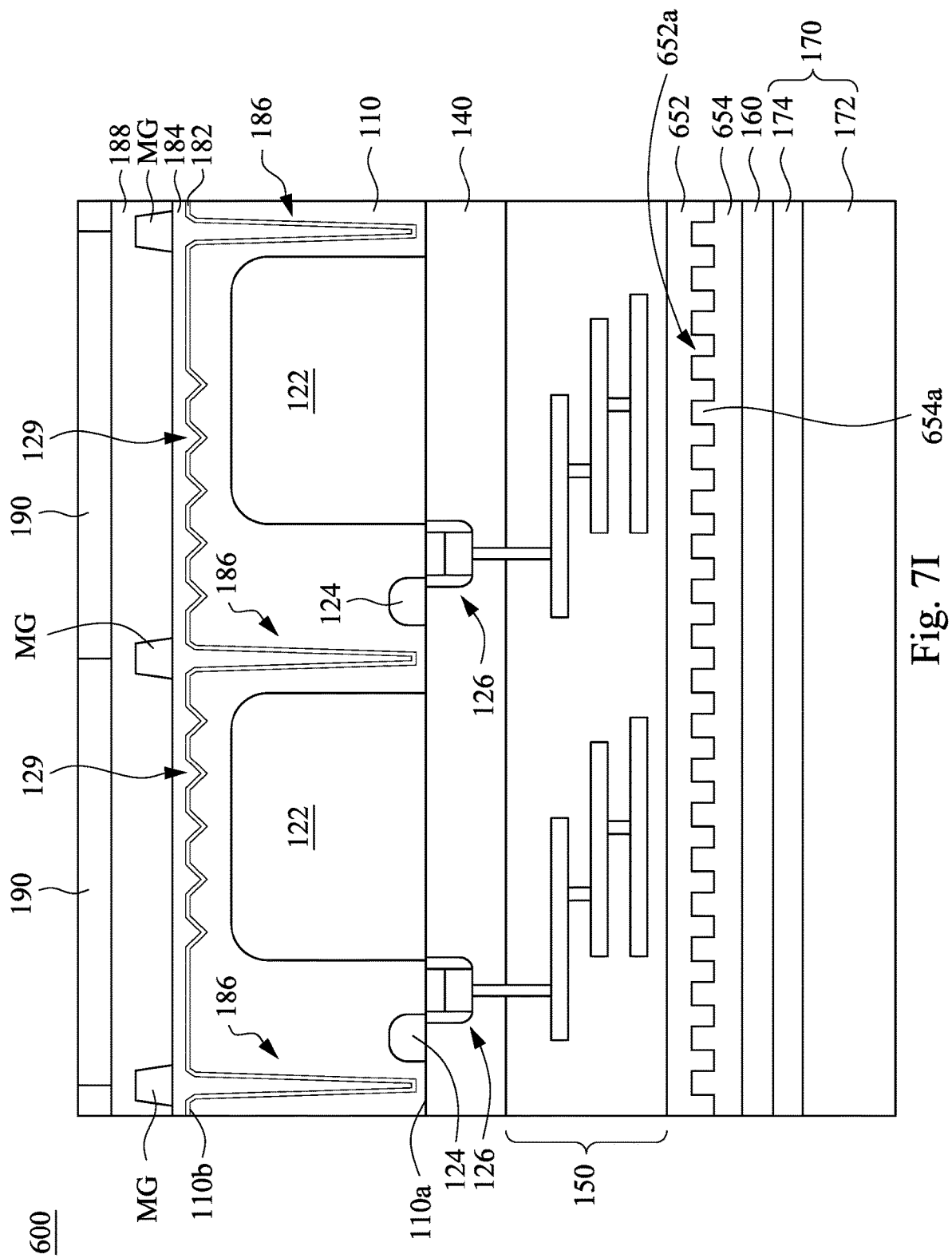
Figure 8:
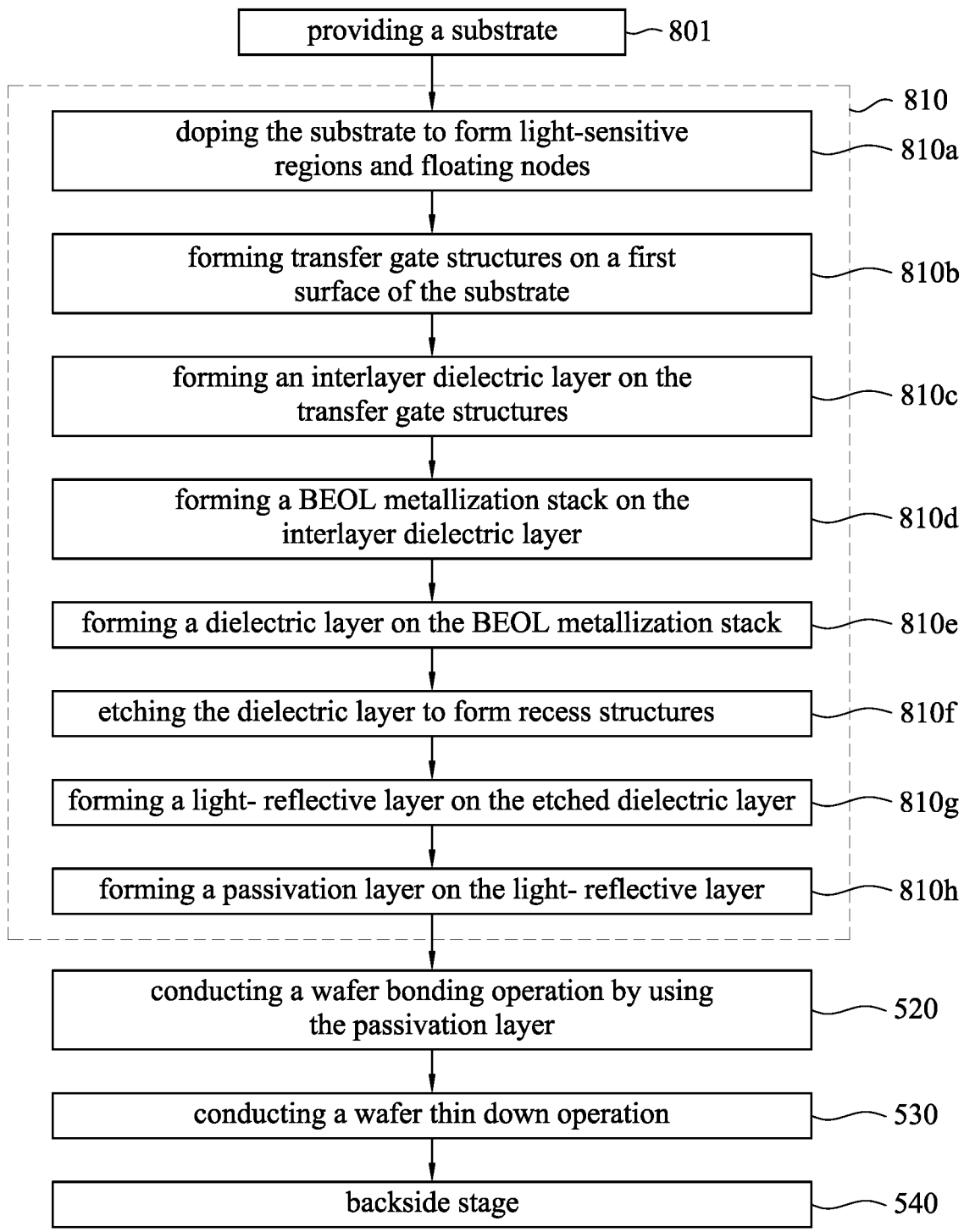
FIG. 8 is a flow chart of a method for fabricating an image sensor in accordance with some embodiments of the present disclosure.

At operation 810f, the dielectric layer 652 is etched to form the recess structures 652a, as shown in FIG. 7F. In some embodiments, the dielectric layer 652 is etched by using a wet etching operation or dry etching operation. At operation 810g, the light-reflective layer 654 is formed on the etched dielectric layer 652, as shown in FIG. 7G In some embodiments, the light-reflective layers 654 has the protrusion portions 654a filling the recess structures 652a. In some embodiments, because the recess structures 652a are rectangular recesses arranged in a periodic structure, the protrusion portions 654a of the light-reflective layers 654 are formed to be cubes arranged in another periodic structure. At operation 810h, the passivation layer 160 is formed on the light-reflective material layer 654, as shown in FIG. 7H. Then operations 520 to 530 and the back-side stage 540 are performed, as shown in FIG. 7I.

In the above embodiments, at least one light-reflective layer is provided for a front side of an image sensor. In some embodiments, a first surface of a substrate is etched to form plural recess structures, and then plural light-reflective layers are formed on the recess structures. The recess structures of the first surface are filled with protrusion portions of the light-reflective layers. The recess structures of the first surface are arranged in a periodic structure, such that the protrusion portions of the light-reflective layers are arranged in another periodic structure. In some embodiments, each of the recess structures of the first surface may be formed to have a shape of inverted pyramid, and each of the protrusion portions of the light-reflective layers is formed to be a pyramid. The light passing through light-sensing regions of the image sensor can be reflected back to the light-sensing regions by the light-reflective layers, such that the light passing through the light-sensing regions has longer light paths in the light-sensing regions, and opportunity of light absorption of the light-sensing regions is increased, and the QE of the image sensor is improved accordingly.

Further, a second surface of the substrate opposite to the first surface may be etched to form recess structures for a back side of the image sensor. The recess structures of the second surface are capable of reducing reflection of the light emitted to the light-sensing regions of the image sensor, such that more light is received by the light-sensing regions and the QE of the image sensor is improved.

In accordance with an embodiment of the present disclosure, the present disclosure discloses an image sensor including a substrate, transfer gate structures, light-sensitive regions, transfer gate structures and at least one light-reflective layer. The substrate has a first surface and a second surface opposite to the first surface. The transfer gate structures are disposed on the first surface of the substrate. The light-sensitive regions are formed in the substrate. Each of the light-sensitive regions is located in the substrate and is disposed between two adjacent transfer gate structures. The at least one light-reflective layer is disposed on the first surface, in which the at least one light-reflective layer has a plurality of protrusion structures towards the light-sensitive regions for reflecting incident light to the light-sensitive regions.

In some embodiments, the first surface of the substrate has recess structures towards the light-sensitive regions, and the at least one light-reflective layer fills the recess structures and is disposed between two adjacent transfer gate structures, such that the at least one light-reflective layer has the protrusion structures.

In some embodiments, the image sensor further includes a liner layer conformal to surfaces of the recess structures, wherein the light-reflective layer covers the liner layer.

In some embodiments, each of the recess structures of the first surface of the substrate is an inverted pyramid recess.

In some embodiments, the image sensor further includes a dielectric layer disposed between the substrate and the at least one light-reflective layer, in which the dielectric layer has a plurality of recess structures matching with the protrusion structures of the at least one light-reflective layer.

In some embodiments, the second surface of the substrate has a plurality of recess structures towards the light-sensitive regions.

In some embodiments, each of the recess structures of the second surface of the substrate is an inverted pyramid recess.

In some embodiments, the image sensor further includes a dielectric layer covering the second surface of the substrate.

In some embodiments, the dielectric layer comprises a plurality of deep trench isolations each of which is disposed between the two adjacent light-sensitive regions.

In accordance with an embodiment of the present disclosure, the image sensor further includes a liner conformal to surfaces of the recess structures of the second surface of the substrate, wherein the dielectric layer covers the liner.

In accordance with an embodiment of the present disclosure, the present disclosure discloses a method for fabricating an image sensor. In the method, at first, a substrate having a first surface and a second surface opposite to the first surface is provided. Then, light-sensitive regions are formed in the substrate. Thereafter, transfer gate structures are formed on the first surface of the substrate, such that each of the light-sensitive regions is located between two adjacent transfer gate structures. Then, the first surface of the substrate is formed to form recess structures on the light-sensitive regions. Thereafter, light-reflective layers are formed to cover the recess structures of the first surface of the substrate, in which the recess structures are filled with a plurality of protrusion structures of the light-reflective layers towards the light-sensitive regions.

In some embodiments, each of the recess structures is an inverted pyramid recess.

In some embodiments, in the operation for forming the light-reflective layers covering the recess structures, at first, a light-reflective material layer is formed to cover the transfer gate structures and the first surface of the substrate. Then, masks are formed on the light-reflective material layer corresponding to the light-sensitive regions to define exposed portions of the light-reflective material layer. Thereafter, the exposed portions of the light-reflective material layer are removed to form the light-reflective layers located between the transfer gate structures.

In some embodiments, the method further includes etching the second surface of the substrate to form a plurality of recess structures corresponding to the light-sensitive regions.

In some embodiments, the method further includes etching the second surface of the substrate to form deep trenches between the light-sensitive regions; and forming a dielectric layer on the second surface of the substrate to fill the deep trenches with portions of the dielectric layer.

In accordance with an embodiment of the present disclosure, the present disclosure discloses a method for fabricating an image sensor. In the method, at first, a substrate having a first surface and a second surface opposite to the first surface is provided. Then, light-sensitive regions are formed in the substrate. Thereafter, transfer gate structures are formed on the first surface of the substrate, such that each of the light-sensitive regions is located between two adjacent transfer gate structures. Then, a dielectric layer is formed on the transfer gate structures and the first surface of the substrate. Thereafter, the dielectric layer is etched to form recess structures on the light-sensitive regions. Then, a light-reflective layer is formed on the dielectric layer, in which the light-reflective layer has protrusion structures filling the recess structures and towards the light-sensitive regions.

In some embodiments, each of the recess structures is an inverted pyramid recess.

In some embodiments, the method further includes etching the second surface of the substrate to form a plurality of recess structures corresponding to the light-sensitive regions.

In some embodiments, in the operation for etching the second surface of the substrate, at first, a hard mask is formed on the second surface of the substrate. Then, the hard mask is patterned to form openings in the hard mask. Thereafter, a wet etching operation is performed on the second surface of the substrate to form the recess structures of the second surface of the substrate.

In some embodiments, the method further includes etching the second surface of the substrate to form a plurality of deep trenches between the light-sensitive regions; and forming a dielectric layer on the second surface of the substrate to fill the deep trenches with portions of the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:
    a substrate having a first surface and a second surface opposite to the first surface;
    a plurality of transfer gate structures disposed on the first surface of the substrate;
    a plurality of gate spacers on sidewalls of the transfer gate structures;

a plurality of light-sensitive regions each of which is located in the substrate and is disposed between two adjacent transfer gate structures;

at least one light-reflective layer disposed on the first surface, wherein the first surface of the substrate has a plurality of recess structures towards the light-sensitive regions, and the at least one light-reflective layer fills the recess structures and is disposed between two adjacent transfer gate structures such that the at least one light-reflective layer has a plurality of protrusion structures towards the light-sensitive regions for reflecting incident light to the light-sensitive regions; and an interlayer dielectric (ILD) layer disposed on the first surface and covering the transfer gate structures and the light-reflective layer, wherein the ILD layer is in contact with a sidewall of the light-reflective layer.

2. The image sensor of claim 1, further comprising a liner layer conformal to surfaces of the recess structures, wherein the light-reflective layer covers the liner layer.

3. The image sensor of claim 1, wherein each of the recess structures of the first surface of the substrate is an inverted pyramid recess.

4. The image sensor of claim 1, further comprising a dielectric layer disposed between the substrate and the at least one light-reflective layer, wherein the dielectric layer has a plurality of recess structures matching with the protrusion structures of the at least one light-reflective layer.

5. The image sensor of claim 1, wherein the second surface of the substrate has a plurality of recess structures towards the light-sensitive regions.

6. The image sensor of claim 5, wherein each of the recess structures of the second surface of the substrate is an inverted pyramid recess.

7. The image sensor of claim 5, further comprises a dielectric layer covering the second surface of the substrate.

8. The image sensor of claim 7, wherein the dielectric layer comprises a plurality of deep trench isolations each of which is disposed between two adjacent light-sensitive regions.

9. The image sensor of claim 7, further comprises a liner conformal to surfaces of the recess structures of the second surface of the substrate, wherein the dielectric layer covers the liner.

10. The image sensor of claim 1, wherein the at least one light-reflective layer comprises metal.

11. An image sensor, comprising:
a substrate having a first surface and a second surface opposite to the first surface;
a transfer gate structure disposed over the first surface of the substrate;
a floating region in the substrate and adjacent to a first side of the transfer gate structure;
a light sensing region in the substrate and adjacent to a second side of the transfer gate structure opposite to the first side of the transfer gate structure;

an interlayer dielectric (ILD) layer disposed over the first surface of the substrate and covering the transfer gate structure and the light sensing region;
a metallization stack disposed over the ILD layer; and
a light-reflective layer disposed over the metallization stack, the metallization stack being vertically between the ILD layer and the light-reflective layer, wherein the light-reflective layer has a plurality of protrusions extending toward the substrate.

12. The image sensor of claim 11, wherein the light-reflective layer comprises metal.

13. The image sensor of claim 11, further comprising a dielectric layer over the second surface of the substrate, wherein the dielectric layer has a plurality of protrusions embedded in the substrate.

14. The image sensor of claim 11, wherein the ILD layer is in contact with a surface of the light-reflective layer distal to the substrate.

15. The image sensor of claim 11, further comprising a dielectric layer between the light-reflective layer and the metallization stack.

16. An image sensor, comprising:
a semiconductor substrate having a first surface and a second surface opposite to the first surface, wherein the first surface of the semiconductor substrate has a plurality of recessed structures;
a transfer gate structure disposed on the first surface of the semiconductor substrate;
a light sensing region in the semiconductor substrate and adjacent to the transfer gate structure;
a light-reflective metal layer over the first surface of the semiconductor substrate and covering the light sensing region, the light-reflective metal layer having a plurality of first protrusions matching shapes of the recessed structures; and
a first dielectric layer over the second surface of the semiconductor substrate, the first dielectric layer having a plurality of second protrusions, wherein a width of the first protrusions of the light-reflective metal layer decreases toward a first direction, and a width of the second protrusions of the first dielectric layer decreases in a first direction toward a second direction opposite to the first direction.

17. The image sensor of claim 16, wherein the first protrusions of the light-reflective metal layer at least partially overlap the second protrusions of the first dielectric layer.

18. The image sensor of claim 16, wherein the first protrusions of the light-reflective metal layer are above a top surface of the transfer gate structure.

19. The image sensor of claim 18, wherein the first protrusions of the light-reflective metal layer have a rectangular shape.

20. The image sensor of claim 16, wherein the first protrusions of the light-reflective metal layer are below a top surface of the transfer gate structure.

* * * * *